US010200050B1

(12) United States Patent
Ren

(10) Patent No.: US 10,200,050 B1
(45) Date of Patent: Feb. 5, 2019

(54) AUTO-PHASE-SHIFTING AND DYNAMIC ON TIME CONTROL CURRENT BALANCING MULTI-PHASE CONSTANT ON TIME BUCK CONVERTER

(71) Applicant: Integrated Device Technology, Inc., San Jose, CA (US)

(72) Inventor: Chenxiao Ren, Fremont, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/904,320

(22) Filed: Feb. 24, 2018

(51) Int. Cl.
  *G05F 1/00* (2006.01)
  *H02M 3/156* (2006.01)
  *H03L 7/24* (2006.01)
  *G05F 3/04* (2006.01)
(52) U.S. Cl.
  CPC . *H03L 7/24* (2013.01); *G05F 3/04* (2013.01)
(58) Field of Classification Search
  CPC ..................................... H03L 7/24; G05F 3/04
  See application file for complete search history.

(56) References Cited

U.S. PATENT DOCUMENTS

| 8,537,572 B2 * | 9/2013 | Fornage | H02M 3/33507 |
| | | | 363/21.12 |
| 9,780,645 B2 * | 10/2017 | Fornage | H02M 1/42 |

* cited by examiner

*Primary Examiner* — Kenneth B Wells
(74) *Attorney, Agent, or Firm* — Christopher P. Maiorana, PC

(57) ABSTRACT

An apparatus including a first circuit and a second circuit. The first circuit may generate an output signal with a regulated voltage and maintain a constant switch frequency having a first on time and a first off time. The second circuit may generate a shifted signal based on a phase delay with respect to the output signal and maintain a shifted frequency having a second on time and a second off time. The second on time may follow the first on time by the phase delay. The second on time may be based on the first on time and transient conditions of a load. The apparatus may implement an automatic phase shift adjustment. A current sensing comparison may implement a cycle-by-cycle comparison between the output signal and the shifted signal to determine the second on time and perform a tuning operation to achieve inductor current balancing.

15 Claims, 18 Drawing Sheets

AUTO-PHASE-SHIFTING AND DYNAMIC ON TIME CONTROL CURRENT BALANCING MULTI-PHASE CONSTANT ON TIME BUCK CONVERTER

FIELD OF THE INVENTION

The invention relates to voltage regulation generally and, more particularly, to a method and/or apparatus for implementing an auto-phase-shifting and dynamic ON time control current balancing multi-phase constant ON time buck converter.

BACKGROUND

Constant ON time (COT) hysteresis converters are used in fast, dynamic response, voltage regulated (VR) systems. Fast, dynamic response VR systems include low voltage microprocessor and dual in-line memory module (DIMM) applications. COT hysteresis buck converters show attractive advantages such as a fast response time. Conventional multi-phase buck converters are built with voltage-mode or peak-current-mode buck structure that have a synchronized clock and several current sharing circuits. The conventional implementation is relatively slow compare to a COT hysteresis buck topology. When load conditions are increased, the multi-phase buck converter is needed to efficiently accommodate the heavy load transient. The nature of COT buck converters result in a switch frequency that does not have steady phase alignment. Using solutions based on digital signal processing (DSP) or peak current detection to implement a multiple phase hysteresis buck converter is impractical for mainstream applications. Without steady phase alignment, implementing multi-phase operation is a challenge.

It would be desirable to implement an auto-phase-shifting and dynamic ON time control current balancing multi-phase constant ON time buck converter.

SUMMARY

The invention concerns an apparatus including a first circuit and a second circuit. The first circuit may be configured to generate an output signal with a regulated voltage and maintain a constant switch frequency having a first on time and a first off time. The second circuit may be configured to generate a shifted signal based on a phase delay with respect to the output signal and maintain a shifted frequency having a second on time and a second off time. The second on time may follow the first on time by a constant amount of the phase delay. The second on time may be based on the first on time and transient conditions of a load. The apparatus may implement an automatic phase shift adjustment. A current sensing comparison may implement a cycle-by-cycle comparison between the output signal and the shifted signal to determine the second on time of the second circuit and perform a tuning operation to achieve inductor current balancing.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing an auto-phase-shift and dynamic ON time, control current balancing, multi-phase, master-slave COT (constant ON time) buck converter that may (i) react quickly to sudden step loads, (ii) maintain a constant switch frequency, (iii) implement an automatic phase-shift, (iv) implement a cycle-by-cycle current comparison, (v) digitally adjust an ON time to match an inductor current, (vi) provide steady phase alignment, (vii) implement a master-slave architecture and/or (viii) be implemented as one or more integrated circuits.

Figure 1:
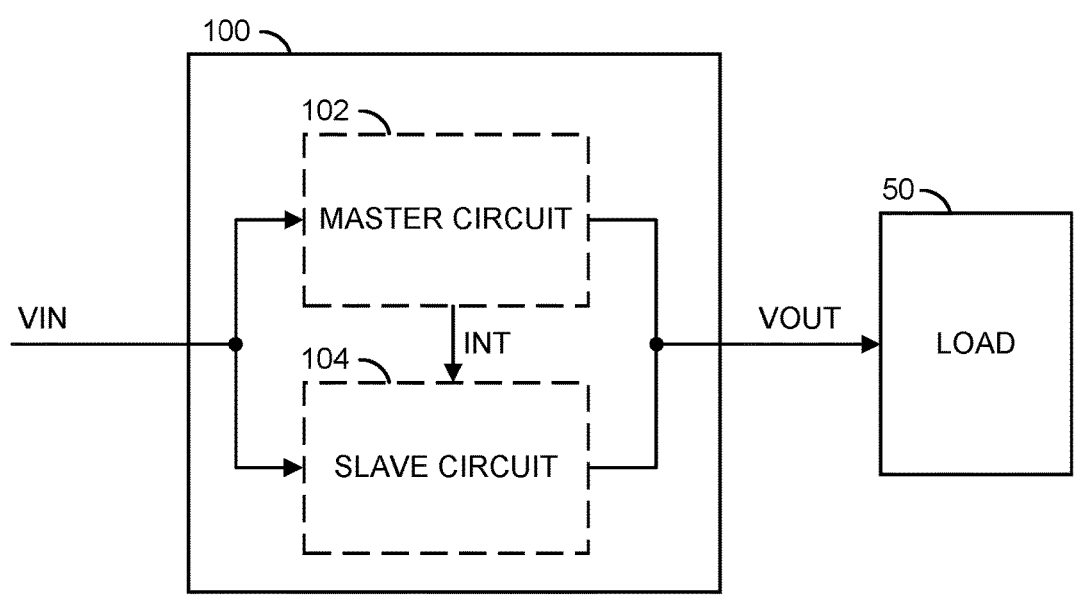
FIG. 1 is a block diagram illustrating a context of an embodiment of the present invention.

Referring to FIG. 1, a block diagram is shown in accordance with an embodiment of the invention. A block (or circuit) 50 and/or a block (or circuit 100) is shown. The block 50 may implement a load circuit. The block 100 may implement an apparatus or module or circuit. The apparatus 100 may be an auto-phase-shift and dynamic ON time, control current balancing, multi-phase, master-slave COT (constant ON time) buck converter. In some embodiments, the apparatus 100 may be implemented as a component in a DDR5 SDRAM (double data rate fifth generation synchronous dynamic random-access memory) application (e.g., for which a specification standard is currently under development by The Joint Electron Device Engineering Council (JEDEC)). In some embodiments, the apparatus 100 may be implemented in power management integrated circuit products. The implementation of the apparatus 100 may be varied according to the design criteria of a particular implementation.

The apparatus 100 may receive a signal (e.g., VIN). The apparatus 100 may generate a signal (e.g., VOUT). The signal VIN may be an input voltage. The signal VOUT may be a voltage regulated output signal. The signal VOUT may be presented to the load circuit 50. The apparatus 100 may comprise a block (or circuit) 102 and/or a block (or circuit) 104. The circuit 102 may implement a master circuit portion of the apparatus 100. The circuit 104 may implement a slave circuit portion of the apparatus 100. A signal (e.g., INT) is shown between the circuit 102 and the circuit 104. Details of the master circuit 102 and/or the slave circuit 104 may be described in more detail in association with FIGS. 2-4. The apparatus 100 may comprise other components (not shown). The number, type and/or arrangement of the components may be varied according to the design criteria of a particular implementation.

The apparatus 100 may implement a multi-phase buck converter topology. The master circuit 102 and/or the slave circuit 104 may each be configured as buck converter circuits operating in parallel between the input VIN and the load 50. Each of the multiple (e.g., 2) phases may be turned ON at equally spaced intervals (e.g., a phase delay) over a switching period. The apparatus 100 may be configured to ensure that the current of the load 50 is balanced evenly across the master circuit 102 and the slave circuit 104.

The apparatus 100 may be configured to respond to changes at the load 50. In one example, the changes at the load 50 may be transient conditions. Implementing the master circuit 102 and/or the slave circuit 104 may enable the response of the apparatus 100 to change quickly. In an example, the apparatus 100 implementing the master circuit 102 and the slave circuit 104 (e.g., two circuits each providing one of two phases) in parallel may switch twice as fast (e.g., compared to a single phase converter) without incurring switching losses.

Implementing the master circuit 102 and/or the slave circuit 104 (e.g., a multi-phase implementation) may decrease a switching ripple. For example, DDR5 specifications may have tight ripple requirements. The multi-phase implementation may also split a current of the load 50 across the phases. For example, splitting the load 50 across the master circuit 102 and/or the slave circuit 104 may enable heat losses on each of the switches to be spread across both circuits.

Figure 2:
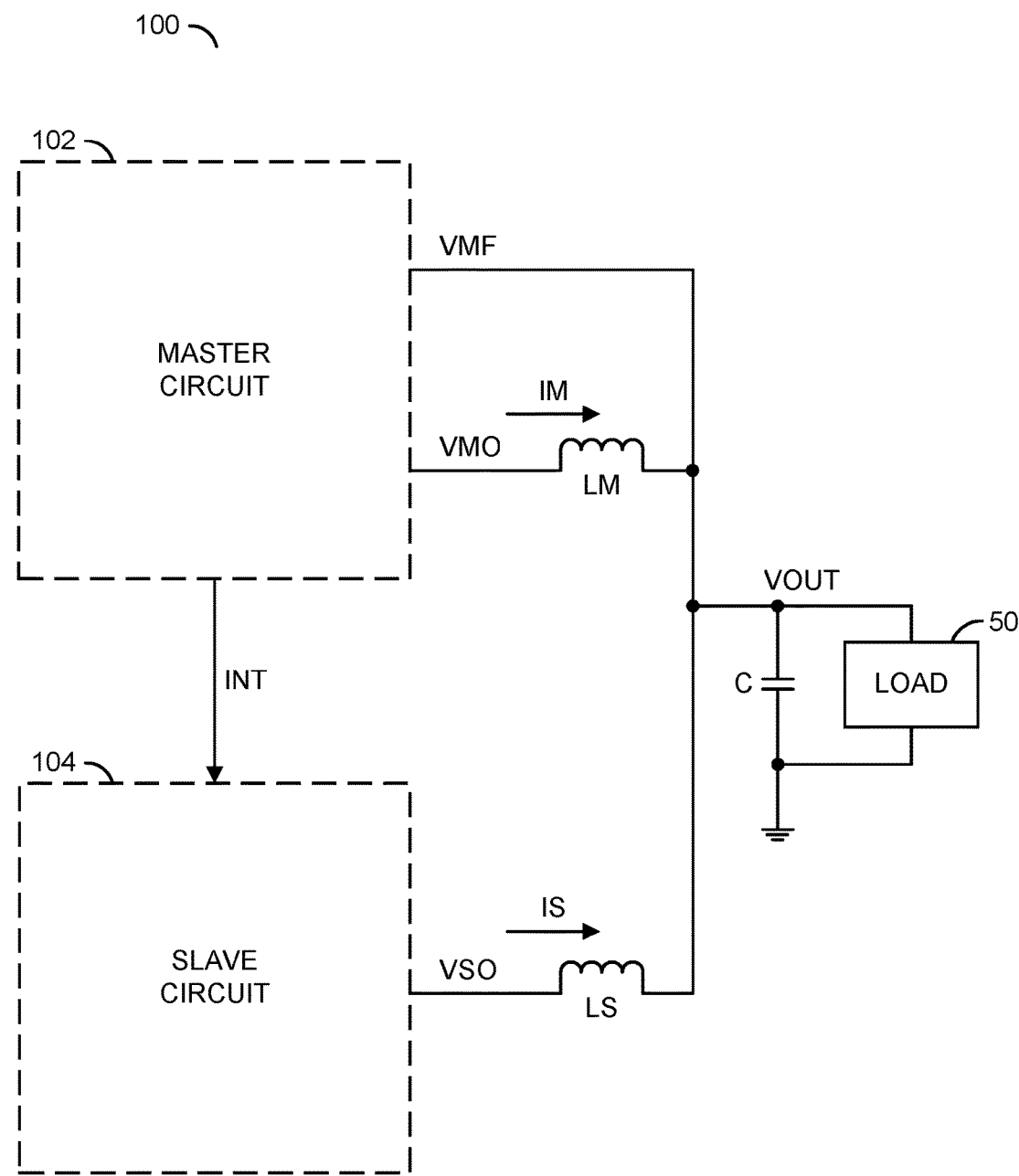
FIG. 2 is a diagram illustrating an example implementation of an auto-phase shifting and dynamic ON time control current balancing, multi-phase, master-slave constant ON time buck converter.

Referring to FIG. 2, a diagram illustrating an example implementation of an auto-phase shifting and dynamic ON time control current balancing, multi-phase, master-slave constant ON time buck converter 100 is shown. Connections are shown between the master circuit 102, the slave circuit 104 and the load 50. The connections shown may be a representative simplification of the apparatus 100. The circuit topography of the interconnections of the master circuit 102, the slave circuit 104 and the load 50 may be varied according to the design criteria of a particular implementation.

The master circuit 102 may communicate the signal INT, receive a signal (e.g., VMF) and/or present a signal (e.g., VMO). The slave circuit 104 may communicate the signal INT and/or present a signal (e.g., VSO). The load 50 may receive the signal VOUT. The signal VMF may be a feedback signal. For example, the signal VMF may provide a sample of the signal VOUT to the master circuit 102. The signal VMO may be an output signal generated by the master circuit 102. The signal VMO may be a regulated voltage. In an example, the signal VMO may be one interval of the switching period for the load voltage VOUT.

The signal VSO may be an output signal generated by the slave circuit 104. In an example, the signal VSO may be another interval of the switching period for the load voltage VOUT. The signal VSO may be a shifted signal (e.g., based on a phase delay) with respect to the output signal VMO. For example, the shifted signal VSO may be shifted with respect to the output signal VMO based on a detected phase difference (e.g., the signal VSO may lag and/or follow the signal VMO by a phase delay). The circuit topology of the apparatus 100 may comprise other signals (such as reference voltages and/or clock signals, not shown). The number of signals and/or the connections between the signals may be varied according to the design criteria of a particular implementation.

In the example shown, the circuit topography of the apparatus 100 may comprise an inductor (e.g., LM), an inductor (e.g., LS) and/or a capacitor (e.g., C). The inductor LM may be at an output of the master circuit 102. The inductor LS may be at an output of the slave circuit 104. The capacitor C may be in parallel with the load 50. A current (e.g., IM) of the output signal VMO may be an inductor current of the inductor LM. A current (e.g., IS) of the output signal VSO may be an inductor current of the inductor LS.

The apparatus 100 comprising the master circuit 102 and/or the slave circuit 104 may implement a Master-Slave COT buck architecture. The architecture of the apparatus 100 may implement a steady phase alignment to enable a multi-phase operation. The master circuit 102 may be configured to provide regulation of the signal VOUT. The master circuit 102 may be configured to provide and/or maintain a constant switch frequency. The slave circuit 104 may be configured to provide and/or maintain a shifted switch frequency.

The master circuit 102 may assert an ON time (e.g., TON1). The slave circuit 104 may assert an ON time (e.g., TON2). The slave circuit 104 may be configured to follow the ON time TON1 of the master circuit 102 (e.g., by the phase delay). The slave circuit 104 may assert the ON time TON2 based on the transient conditions of the load 50. In one example, a width of the ON time TON2 may be digitally adjusted based on the transient conditions of the load 50. The slave circuit 104 may be implemented with a built-in auto-phase shift technique. The auto-phase shift technique may enable the slave circuit 104 to follow the ON time TON1.

In one example, the auto-phase shift technique may be configured to assert the ON time TON2 in response to a steady-state transient condition of the load 50 and/or a step down transient condition of the load 50. With steady-state and/or load step down transient conditions of the load 50, the slave circuit 104 may assert the ON time TON2 having a phase delay of 180 degrees after the ON time TON1 of the master circuit 102. In another example, the auto-phase shift technique may be configured to assert the ON time TON2 in response to a step up load transient condition of the load 50. With a load step up transient condition of the load 50, the slave circuit 104 may assert the ON time TON2 based on a speed (e.g., amount of change) of the transient of the load 50. The slave circuit 104 may assert the ON time TON2 using the phase-shift technique in order to increase the response for a smaller undershoot.

The master circuit 102 may have an OFF time (e.g., TOFF1). The slave circuit 104 may have an OFF time (e.g., TOFF2). The apparatus 100 may perform a valley current sensing operation during each of the OFF time TOFF1 and/or the OFF time TOFF2. The apparatus may be configured to implement a cycle-by-cycle current comparison technique (e.g., the current IM of the master circuit 102 and the current IS of the slave circuit 104). The cycle-by-cycle current comparison technique may be configured to determine the ON time TON2 of the slave circuit 104 and/or perform a tuning operation to achieve inductor current balancing. The slave circuit 104 may be configured to perform a digitized smart adjustment of the ON time TON2 (e.g., in response to the tuning operation). The digitized smart adjustment may be operational to adjust the ON time TON2 of the slave circuit 104 to match the inductor current IS to the inductor current IM (e.g., match the inductor current of the slave circuit 104 to the inductor current of the master circuit 102).

The architecture implemented by the apparatus 100 may enable a decrease in switching ripple due to an increased effective frequency. For example, any time that n times the duty cycle is an integer, the switching ripple may be reduced to 0. Generally, a rate at which the inductor current IS is increasing in the phases which are switched ON may match (e.g., exactly match) a rate at which the inductor current IS is decreasing in the phases which are switched OFF.

Figure 3:
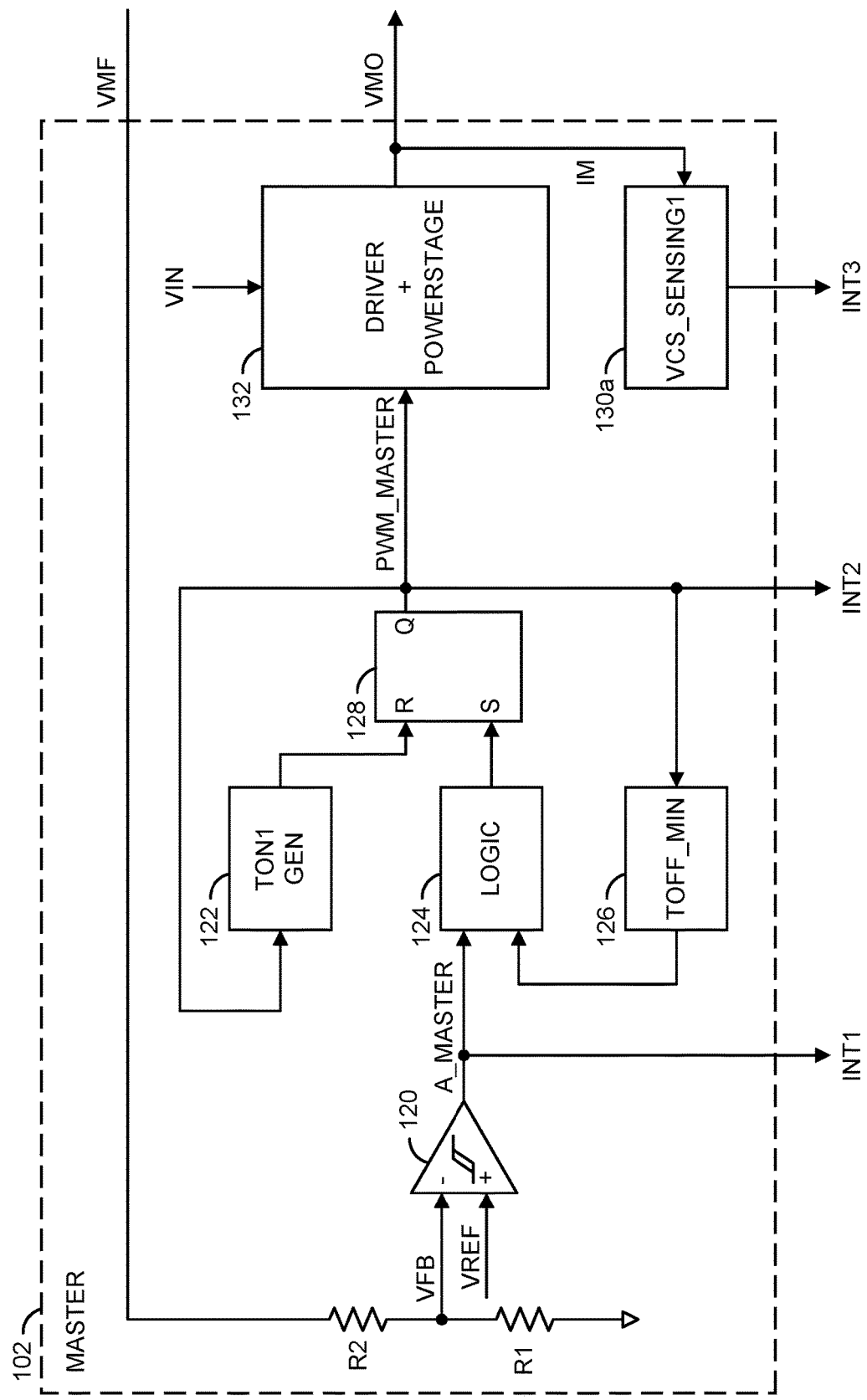
FIG. 3 is a diagram illustrating an example implementation of a master circuit portion of the apparatus.

Referring to FIG. 3, a diagram illustrating an example implementation of a master circuit portion 102 of the apparatus 100 is shown. The master circuit 102 may receive the input feedback signal VMF, the signal VIN and/or a signal (e.g., VREF). The signal VREF may be a reference signal (e.g., a reference voltage). The master circuit 102 may present the signal VMO, a signal (e.g., INT1), a signal (e.g., INT2) and/or a signal (e.g., INT3). In some embodiments, the signal INT1, the signal INT2 and/or the signal INT3 may be presented to the slave circuit 104. In an example, the signal INT1, the signal INT2 and/or the signal INT3 may implement intermediate signals, status signals and/or control signals (together shown as the signal INT in association with FIG. 1). The master circuit 102 may generate and/or receive other signals (not shown). The number and/or type of signals generated and/or received by the master circuit 102 may be varied according to the design criteria of a particular implementation.

The master circuit 102 may comprise a block (or circuit) 120, a block (or circuit) 122, a block (or circuit) 124, a block (or circuit) 126, a block (or circuit) 128, a block (or circuit) 130a and/or a block (or circuit) 132. The circuit 120 may implement a comparator. The circuit 122 may implement a generator circuit. The circuit 124 may implement a logic circuit. The circuit 126 may implement a feedback circuit. The circuit 128 may implement a RS latch circuit. The circuit 130a may implement a current sensing circuit. The circuit 132 may implement a driver and/or powerstage circuit. The master circuit 102 may further comprise a resistor R1 and/or a resistor R2. The master circuit 102 may comprise other components (not shown). The number, type and/or arrangement of the components of the master circuit 102 may be varied according to the design criteria of a particular implementation.

The comparator 120 may receive the reference signal VREF and a signal (e.g., VFB). The signal VFB may be generated in response to the feedback signal VMF, the resistor R1 and/or the resistor R2. The feedback signal VMF and/or the signal VFB may provide the master circuit 102 an indication of the transient conditions of the load 50. The comparator 120 may generate a signal (e.g., A_MASTER). The signal A_MASTER may be presented to the slave circuit 104 as the signal INT1.

The generator 122 may receive a signal (e.g., PWM_MASTER). The generator 122 may be configured to generate the ON time TON1. The ON time TON1 (e.g., for a next cycle) may be generated in response to the signal PWM_MASTER (e.g., from a current cycle). An output of the generator 122 may be presented to an input of the RS latch 128.

The logic 124 may implement control logic for the master circuit 102. The logic 124 may receive the signal A_MASTER. The logic 124 may receive an input from the feedback circuit 126. The logic 124 may generate an output. The output of the logic 124 may be presented to an input of the RS latch 128. The logic 124 may be configured to determine a response to the transient conditions of the load 50 and/or the current status of the master circuit 102. For example, the signal A_MASTER may provide feedback about the transient conditions and the input from the feedback circuit 126 (e.g., the OFF time TOFF1) may provide feedback about the current status of the master circuit 102.

The feedback circuit 126 may receive the signal PWM_MASTER. The feedback circuit 126 may determine a status of the master circuit 102 (e.g., the OFF time TOFF1) of a current cycle. The current status of the master circuit 102 may be presented to the logic 124.

The RS latch 128 may be configured to receive an input (e.g., an S input) from the logic 124. The RS latch 128 may be configured to receive an input (e.g., an R input) from the generator 122. The RS latch 128 may be configured to generate the signal PWM_MASTER. The signal PWM_MASTER may be a pulse-width modulation signal used to generate the output signal VMO for the current cycle. The signal PWM_MASTER may be presented to the generator 122, the feedback circuit 126 and/or the driver and power-stage 132. The signal PWM_MASTER may be presented to the slave circuit 104 as the signal INT2. In an example, the output from the logic 124 may be used to control the ON time TON1 from the generator 122 (e.g., the RS latch 128 may pass through the output of the generator 122 as the signal PWM_MASTER when enabled by the logic 124).

The current sensing circuit 130a may receive the signal IM. The signal IM may be a sample of the inductor current from the output signal VMO. The current sensing circuit 130a may be configured to detect the inductor current IM out of the master circuit 102. The current sensing circuit 130a may be configured to generate the signal INT3. The signal INT3 may be presented to the slave circuit 104.

The driver and powerstage circuit 132 may be configured to receive the signal PWM_MASTER and the signal VIN. The driver and powerstage circuit 132 may be configured to generate the signal VMO and/or the signal IM. For example, the driver and powerstage circuit 132 may be configured to generate the signal VMO in response to the characteristics of the signal PWM_MASTER and the signal VIN.

Figure 4:
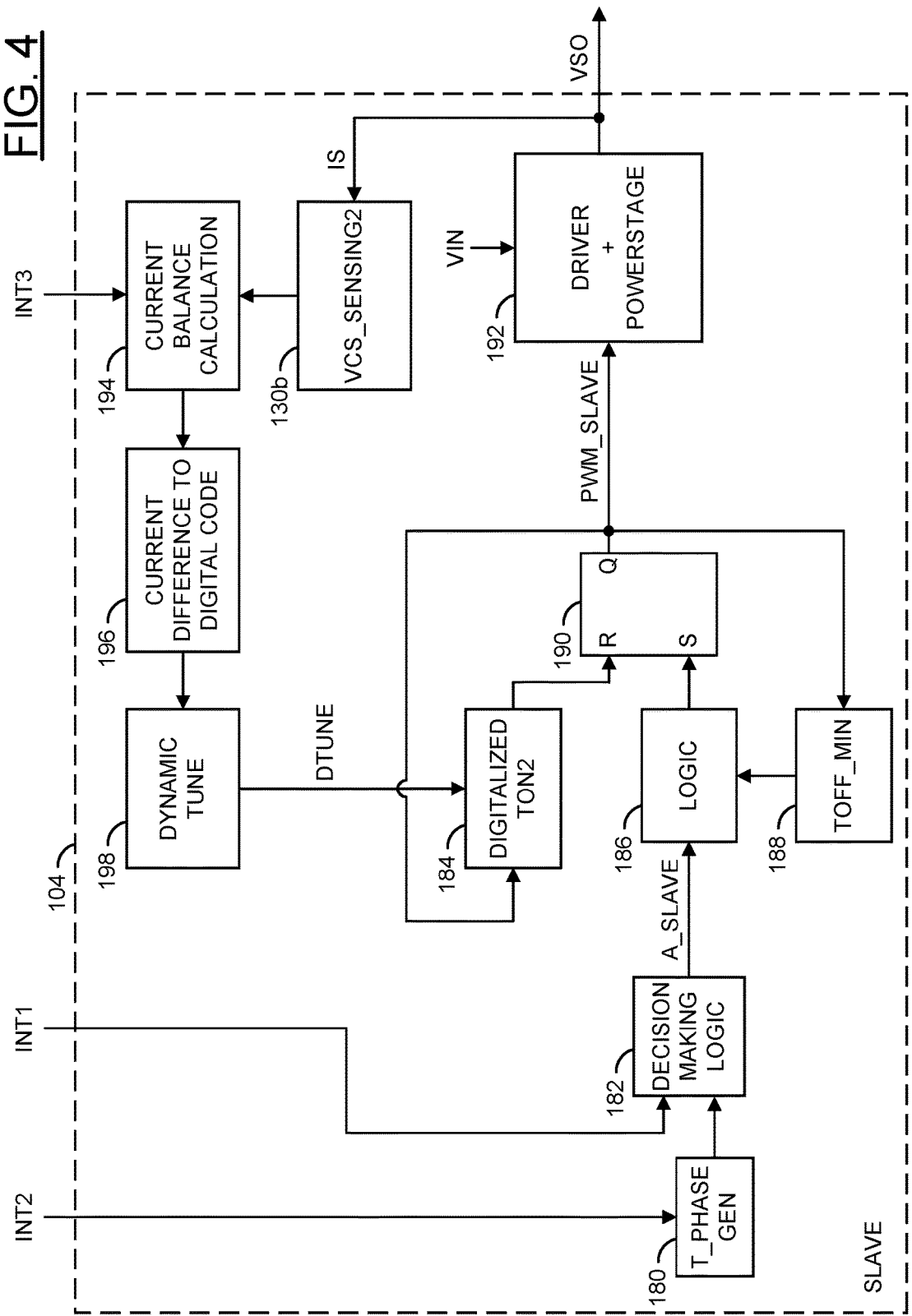
FIG. 4 is a diagram illustrating an example implementation of a slave circuit portion of the apparatus.

Referring to FIG. 4, a diagram illustrating an example implementation of a slave circuit portion 104 of the apparatus 100 is shown. The slave circuit 104 may receive the signal INT1, the signal INT2, the signal INT3 and/or the input signal VIN. The slave circuit 104 may present the signal VSO. In some embodiments, the signal INT1, the signal INT2 and/or the signal INT3 may be received from the master circuit 104. The slave circuit 104 may generate and/or receive other signals (not shown). The number and/or type of signals generated and/or received by the slave circuit 104 may be varied according to the design criteria of a particular implementation.

The slave circuit 104 may comprise a block (or circuit) 130b, a block (or circuit) 180, a block (or circuit) 182, a block (or circuit) 184, a block (or circuit) 186, a block (or circuit) 188, a block (or circuit) 190, a block (or circuit) 192, a block (or circuit) 194, a block (or circuit) 196 and/or a block (or circuit) 198. The circuit 130b may implement a current sensing circuit. The circuit 180 may implement a phase generator circuit. The circuit 182 may implement a decision making logic circuit. The circuit 184 may implement a generator circuit. The circuit 186 may implement a logic circuit. The circuit 188 may implement a feedback circuit. The circuit 190 may implement a RS latch circuit. The circuit 192 may implement a driver and/or powerstage circuit. The circuit 194 may implement a current balance calculation circuit. The circuit 196 may implement a current difference digital code circuit. The circuit 198 may implement a dynamic tune circuit. The slave circuit 104 may comprise other components (not shown). The number, type and/or arrangement of the components of the slave circuit 104 may be varied according to the design criteria of a particular implementation.

The phase generator circuit 180 may be configured to generate a phase delay for the slave circuit 104. The phase delay may be a value (e.g., T_PHASE). The phase generator circuit 180 may generate the phase delay T_PHASE in response to the signal INT2. The signal INT2 may be the PWM_MASTER signal of the master circuit 102 for a current cycle. For example, the phase generator circuit 180 may be configured to generate a phase difference of approximately 180 degrees between the slave output signal VSO and the master output signal VMO (e.g., the signal VSO may lag the signal VMO by 180 degrees). The phase delay T_PHASE may be generated to produce a smooth switching in response to the transient conditions of the load 50.

The decision making logic circuit 182 may be receive the phase delay output from the phase generator 180 and/or the signal INT1. The signal INT1 may the A_MASTER signal of the master circuit 102 for a current cycle. The decision making logic circuit 182 may generate a signal (e.g., A_SLAVE). Details of the decision making logic circuit 182 may be described in association with FIG. 5.

The generator 184 may receive a signal (e.g., PWM_SLAVE) and/or a signal (e.g., DTUNE). The generator 184 may be configured to generate the ON time TON2. The ON time TON2 (e.g., for a next cycle) may be generated in response to the signal PWM_SLAVE (e.g., from a current cycle) and/or the signal DTUNE. The signal DTUNE may be a dynamic adjustment for the ON time TON2. For example, the signal DTUNE may be used to adjust the width of the ON time TON2. An output of the generator 184 may be presented to an input of the RS latch 190.

The logic 186 may implement control logic for the slave circuit 104. The logic 186 may receive the signal A_SLAVE. The logic 186 may receive an input from the feedback circuit 188. The logic 186 may generate an output. The output of the logic 186 may be presented to an input of the RS latch 190. The logic 186 may be configured to determine a response to the current status of the master circuit 102 and/or the current status of the slave circuit 104. For example, the signal A_SLAVE may provide the determined phase delay T_PHASE and the input from the feedback circuit 188 (e.g., the OFF time TOFF2) may provide feedback about the current status of the slave circuit 104.

The feedback circuit 188 may receive the signal PWM_SLAVE. The feedback circuit 188 may determine a status of the slave circuit 104 (e.g., the OFF time TOFF2) of a current cycle. The current status of the slave circuit 104 may be presented to the logic 186.

The RS latch 190 may be configured to receive an input (e.g., an S input) from the logic 186. The RS latch 190 may be configured to receive an input (e.g., an R input) from the generator 184. The RS latch 190 may be configured to generate the signal PWM_SLAVE. The signal PWM_SLAVE may be a pulse-width modulation signal used to generate the output signal VSO for the current cycle. The signal PWM_SLAVE may be presented to the generator 184, the feedback circuit 188 and/or the driver and powerstage 192. In an example, the output from the logic 186 may be used to control the ON time TON2 from the generator 184 (e.g., the RS latch 190 may pass through the output of the generator 184 as the signal PWM_SLAVE when enabled by the logic 186).

The current sensing circuit 130b may receive the signal IS. The signal IS may be a sample of the inductor current from the output signal VSO. The current sensing circuit 130b may be configured to detect the inductor current IS out of the slave circuit 104. The current sensing circuit 130b may be configured to generate an output in response to the signal IS. The output of the current sensing circuit 130b may be presented to the current balance calculation circuit 194.

The driver and powerstage circuit 192 may be configured to receive the signal PWM_SLAVE and the signal VIN. The driver and powerstage circuit 192 may be configured to generate the signal VSO and/or the signal IS. For example, the driver and powerstage circuit 192 may be configured to generate the signal VSO in response to the characteristics of the signal PWM_SLAVE and the signal VIN.

The current balance calculation circuit 194 may be configured to receive the output from the current sensing circuit 130b and/or the signal INT3. The signal INT3 may be the output from the current sensing circuit 130a of the master circuit 102. The current balancing calculation circuit 194 may be configured to perform a current balancing in response to the inductor current signal IM and/or the inductor current signal IS. In an example, the current balancing may be configured to determine the current difference between the inductor current signal IM and the inductor current signal IS. Details of the current balancing performed by the current balance calculation circuit 194 may be described in association with FIG. 13.

The current difference digital code circuit 196 may be configured to receive an output from the current balance calculation circuit 194. The current difference digital code circuit 196 may perform an analog to digital conversion. The current difference to digital code circuit 196 may be configured to generate a digital code in response to the difference (e.g., current difference) between the inductor current IM from the master circuit 102 and the inductor current IS from the slave circuit 104. The digital code output from the current difference to digital code circuit 196 may be presented to the dynamic tuning circuit 198. The dynamic tuning circuit 198 may receive the digital code output from the current difference digital code circuit 196. The dynamic tuning circuit 198 may generate the signal DTUNE. The dynamic tuning circuit 198 may be configured to determine an adjustment to the ON time TON2 of the slave circuit 104 (e.g., a width of the ON time TON2). The adjustment to the ON time TON2 may be determined in response to the current difference between the current IM and the current IS.

The current sensing circuits 130a-130b, the current balance calculation circuit 194, the current difference digital code circuit 196 and/or the dynamic tuning circuit 198 may be configured to perform the cycle-by-cycle current comparison between the master inductor current IM and the slave inductor current IS and/or perform tuning operations. The tuning operations may be implemented to achieve inductor current balancing. The inductor current balancing may be achieved by determining and/or adjusting the second ON time TON2 for the slave circuit 104 (e.g., digitally incrementing and decrementing a width of the ON time TON2). The tuning operations may implement dynamic tuning of the master inductor current IM and the slave inductor current IS for fast current balancing. The tuning operations may be configured to match the slave inductor current IS to the master inductor current IM.

Figure 5:
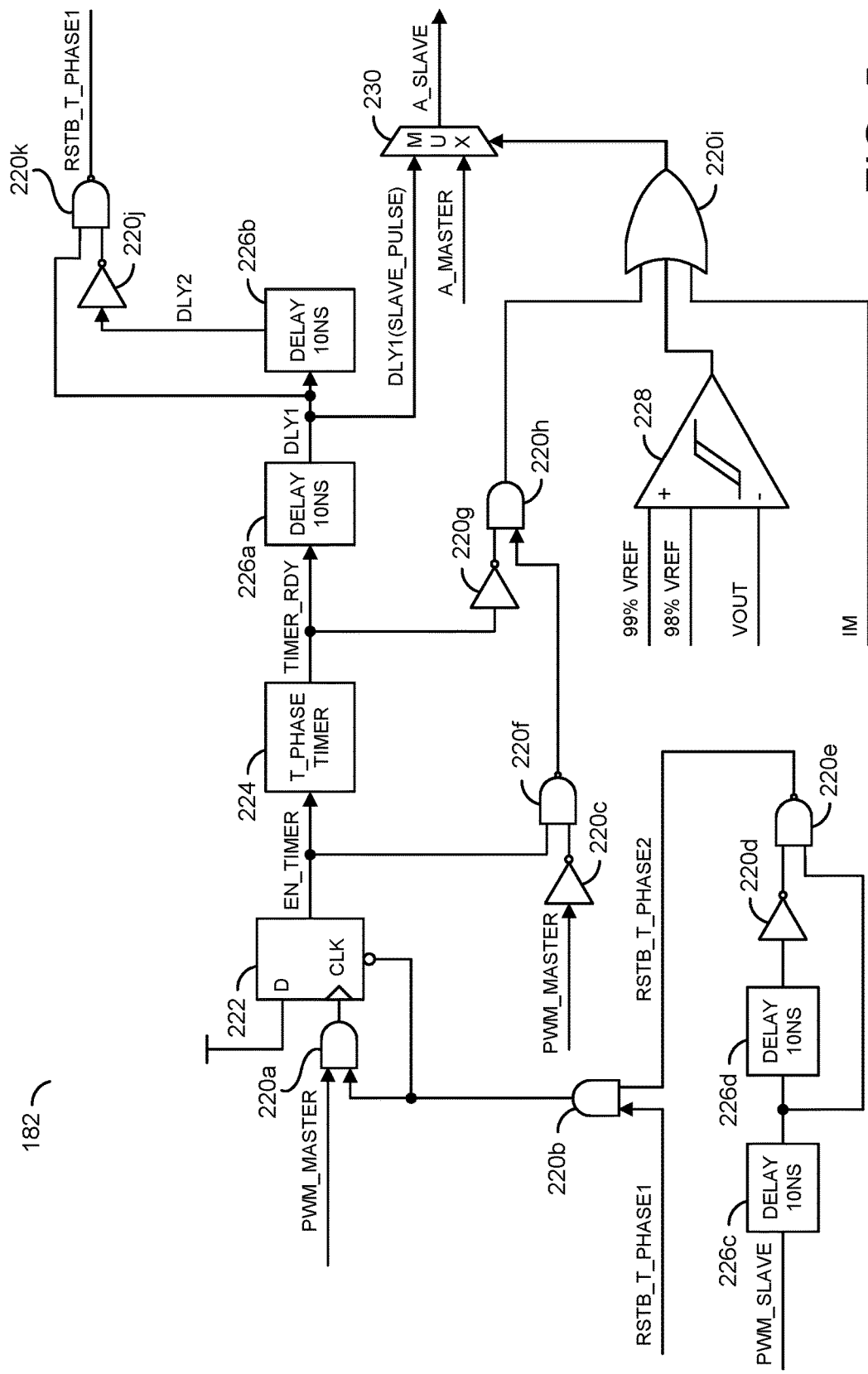
FIG. 5 is a diagram illustrating an example implementation of a decision making logic circuit.

Referring to FIG. 5, a diagram illustrating an example implementation of the decision making logic circuit 182 is shown. The decision making logic circuit 182 may be configured to implement the auto-phase shift for the slave circuit 104. The decision making logic circuit 182 may be configured to generate timing signals to determine the decision window in response to signals received from the master circuit 102.

The decision making logic circuit 182 may comprise blocks (or circuits) 220a-220k, a block (or circuit) 222, a block (or circuit) 224, blocks (or circuits) 226a-226d, a block (or circuit) 228 and/or a block (or circuit) 230. The circuits 220a-220k may implement digital logic circuitry. For example, the circuits 220a-220k may comprise logical AND gates, logical NAND gates, logical OR gates, logical NOT gates and/or equivalent circuits. The circuit 222 may implement a flip-flop circuit. The circuit 224 may implement a timer circuit. The circuits 226a-226d may implement delay circuits. In the example shown, the delay circuits 226a-226d may be operational to perform a 10 ns delay. The circuit 228 may implement a comparator circuit. The circuit 230 may implement a multiplexer circuit. The decision making logic 182 may comprise other components (not shown). The number, type and/or arrangement of the components of the decision making logic 182 may be varied according to the design criteria of a particular implementation.

The flip-flop 222 may comprise an input (e.g., a D input), an input (e.g., a CLK input), an input (e.g., a reset input) and/or an output (e.g., a Q output). For example, the flip-flop 222 may be a D flip-flop. The D input of the flip-flop 222 may receive a signal (e.g., a logical high signal). The CLK input of the flip-flop 222 may receive an output of the gate 220a. The reset input of the flip-flop 222 may receive an output of the gate 220b. The output of the flip-flop 222 may be a signal (e.g., EN_TIMER). The signal EN_TIMER may be presented to the timer circuit 224 and/or an input of the gate 220f.

The timer circuit 224 may implement a timer for the phase delay T_PHASE. The timer circuit 224 may receive the signal EN_TIMER. The signal EN_TIMER may enable the timer circuit 224. The timer circuit 224 may generate a signal (e.g., TIMER_RDY). The signal TIMER_RDY may be presented to the gate 220g and/or the delay circuit 226a.

The delay circuit 226a may receive the signal TIMER_RDY. The delay circuit 226a may generate a signal (e.g., DLY1 and/or SLAVE_PULSE). The signal DLY1 may be presented to the delay circuit 226b, an input of the multiplexer 230 and/or a first input of the gate 220k. The delay circuit 226b may receive the signal DLY1. The delay circuit 226b may generate a signal (e.g., DLY2). The signal DLY2 may be presented to an input of the gate 220j. The gate 220j may perform a logical NOT operation on the signal DLY2. The gate 220j may present an output to a second input of the gate 220k. The gate 220k may perform a logical NAND operation on the signal DLY1 and the inverted signal DLY2. The gate 220k may generate a signal (e.g., RSTB_T_PHASE1).

The gate 220a may receive the signal PWM_MASTER at a first input and an output of the gate 220b at a second input. The gate 220a may perform a logical AND operation. The gate 220a may present an output to the CLK input of the flip-flop 222. The gate 220b may receive the signal RSTB_T_PHASE1 and a signal (e.g., RSTB_T_PHASE2). The gate 220b may perform a logical AND operation. The output of the gate 220b may be presented to the second input of the gate 220a and the reset input of the flip-flop 222.

The delay circuit 226c may receive the signal PWM_SLAVE. The delay circuit 226c may present an output signal to the delay circuit 226d and/or a second input of the gate 220e. The delay circuit 226d may present an output to the gate 220d. The gate 220d may perform a logical NOT operation on the output of the delay circuit 226d. The output of the gate 220d may be presented to a first input of the gate 220e. The gate 220e may perform a logical NAND operation of the output of the gate 220d and the output of the delay circuit 226c. The output of the gate 22e may be the signal RSTB_T_PHASE2.

The gate 220c may receive the signal PWM_MASTER. The gate 220c may perform a logical NOT operation. The gate 220c may present an output to a second input of the gate 220f. The gate 220f may receive the signal EN_TIMER at a first input. The gate 220f may perform a logical NAND operation on the signal EN_TIMER and the inverted signal PWM_MASTER. An output of the gate 220f may be presented to a second input of the gate 220h.

The gate 220g may perform a logical NOT operation on the signal TIMER_RDY. An output of the gate 220g may be presented to a first input of the gate 220h. The gate 220h may perform a logical AND operation on the inverted signal TIMER_RDY and the output of the gate 220f. The output of the gate 220h may be presented to a first input of the gate 220i.

The comparator 228 may receive the signal VREF and/or the signal VOUT. The comparator 228 may present an output to a second input of the gate 220i. The gate 220i may receive the first input from the output of the gate 220h, the second input from the output of the comparator 228 and/or a third input. The third input of the gate 220i may be the signal IM. The gate 220i may perform a logical OR operation. The output of the gate 220i may be presented to a selection input of the multiplexer 230.

The multiplexer 230 may comprise a first input, a second input, the selection input and an output. The first input of the multiplexer 230 may receive the signal DLY1. For example, the first input of the multiplexer 230 may receive the SLAVE_PULSE signal. The second input of the multiplexer 230 may receive the signal A_MASTER. The selection signal may be received from the gate 220i. If the master circuit 102 has triggered the signal IM, then the decision logic circuit 182 may be configured to bypass the signal A_MASTER as the signal A_SLAVE directly (e.g., the selection input from the gate 220i may select the second input of the multiplexer 230). Passing the signal A_MASTER as the signal A_SLAVE may allow the slave circuit 104 to switch according to a status of the signal VOUT (e.g., the transient conditions of the load 50). For example, the output of the slave circuit 104 may not be blocked by the current signal IM of the master circuit 102. The output of the multiplexer 230 may present the signal A_SLAVE. The signal A_SLAVE may be presented to the logic circuit 286 of the slave circuit 104.

Figure 6:
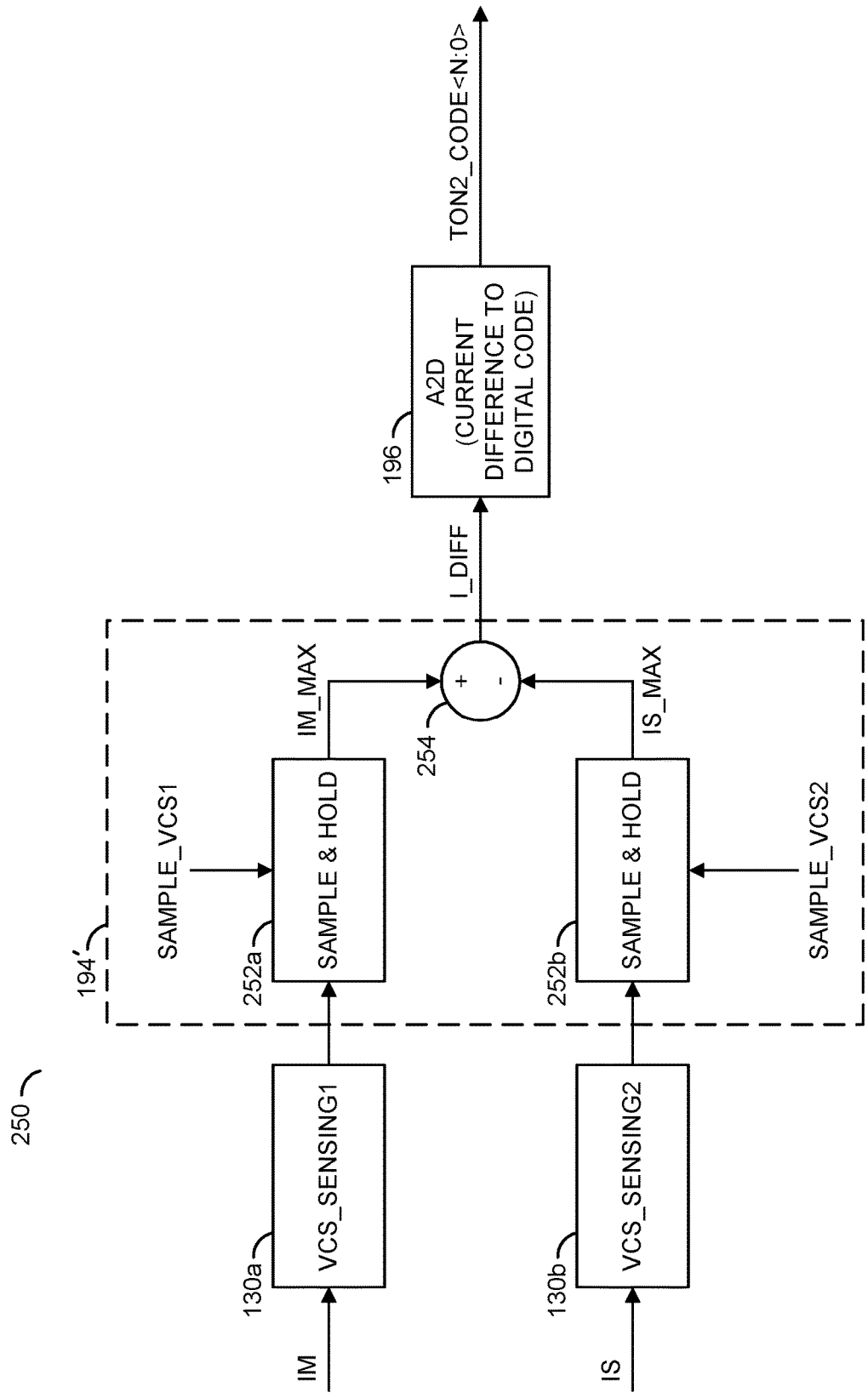
FIG. 6 is a diagram illustrating an example implementation of current balancing.

Referring to FIG. 6, a diagram illustrating an example implementation 250 of current balancing is shown. The example implementation 250 may implement one method (e.g., a sample and hold method) for performing the current balancing and/or tuning operations. Other methods may be implemented by the apparatus 100 to perform the current balancing. The method of current balancing may be varied according to the design criteria of a particular implementation.

The example current balancing implementation 250 may comprise the current sensing circuits 130a-130b, the current balance calculation circuit 194' and/or the current difference digital code circuit 196. In the example shown, the current sensing circuit 130a may receive the inductor current IM, the current sensing circuit 130b may receive the inductor current IS and the current difference digital code circuit 196 may present a signal (e.g., TON2_CODE<N:0>).

The current balance calculation circuit 194' may comprise blocks (or circuits) 252a-252b and/or a block (or circuit) 254. The circuits 252a-252b may each implement a sample and hold circuit. The circuit 254 may be a summation circuit. The current balance calculation circuit 194' may comprise other components (not shown). The number, type and/or arrangement of the components of the current balance calculation circuit 194' may be varied according to the design criteria of a particular implementation.

The sample and hold circuit 252a may receive an input from the current sensing circuit 130a. The sample and hold circuit 252a may be configured to sample the output from the current sensing circuit 130a. For example, the sample and hold circuit 252a may sample a maximum value of the signal IM (e.g., IM_MAX). The sample and hold circuit 252a may receive a signal (e.g., SAMPLE_VCS1). The signal SAMPLE_VCS1 may be an enable signal corresponding to a decision window. The sample and hold circuit 252a may hold the maximum value IM_MAX until the decision window. The sample and hold circuit 252a may present the signal IM_MAX to the summation circuit 254 during the decision window.

The sample and hold circuit 252b may receive an input from the current sensing circuit 130b. The sample and hold circuit 252b may be configured to sample the output from the current sensing circuit 130b. For example, the sample and hold circuit 252b may sample a maximum value of the signal IS (e.g., IS_MAX). The sample and hold circuit 252a may receive a signal (e.g., SAMPLE_VCS2). The signal SAMPLE_VCS2 may be an enable signal corresponding to a decision window. The sample and hold circuit 252b may hold the maximum value IS_MAX until the decision window. The sample and hold circuit 252b may present the signal IS_MAX to the summation circuit 254 during the decision window.

The summation circuit 254 may be configured to receive the maximum current value IM_MAX from the sample and hold circuit 252a and/or the maximum current value IS_MAX from the sample and hold circuit 252b during the decision window. The summation circuit 254 may be configured to compare and/or determine the difference of IM_MAX and IS_MAX during the decision window. The summation circuit 254 may present a signal (e.g., I_DIFF) representing the current difference between the maximum current IM_MAX and the maximum current IS_MAX to the current difference digital code circuit 196. The current difference digital code circuit 196 may generate the signal TON2_CODE<N:0> based on the determined current difference (e.g., based on the signal I_DIFF). The signal TON2_CODE<N:0> may be an incremental or decremental digital code used by the dynamic tuning circuit 198 to generate the signal DTUNE (e.g., for the next ON time TON2).

Figure 7:
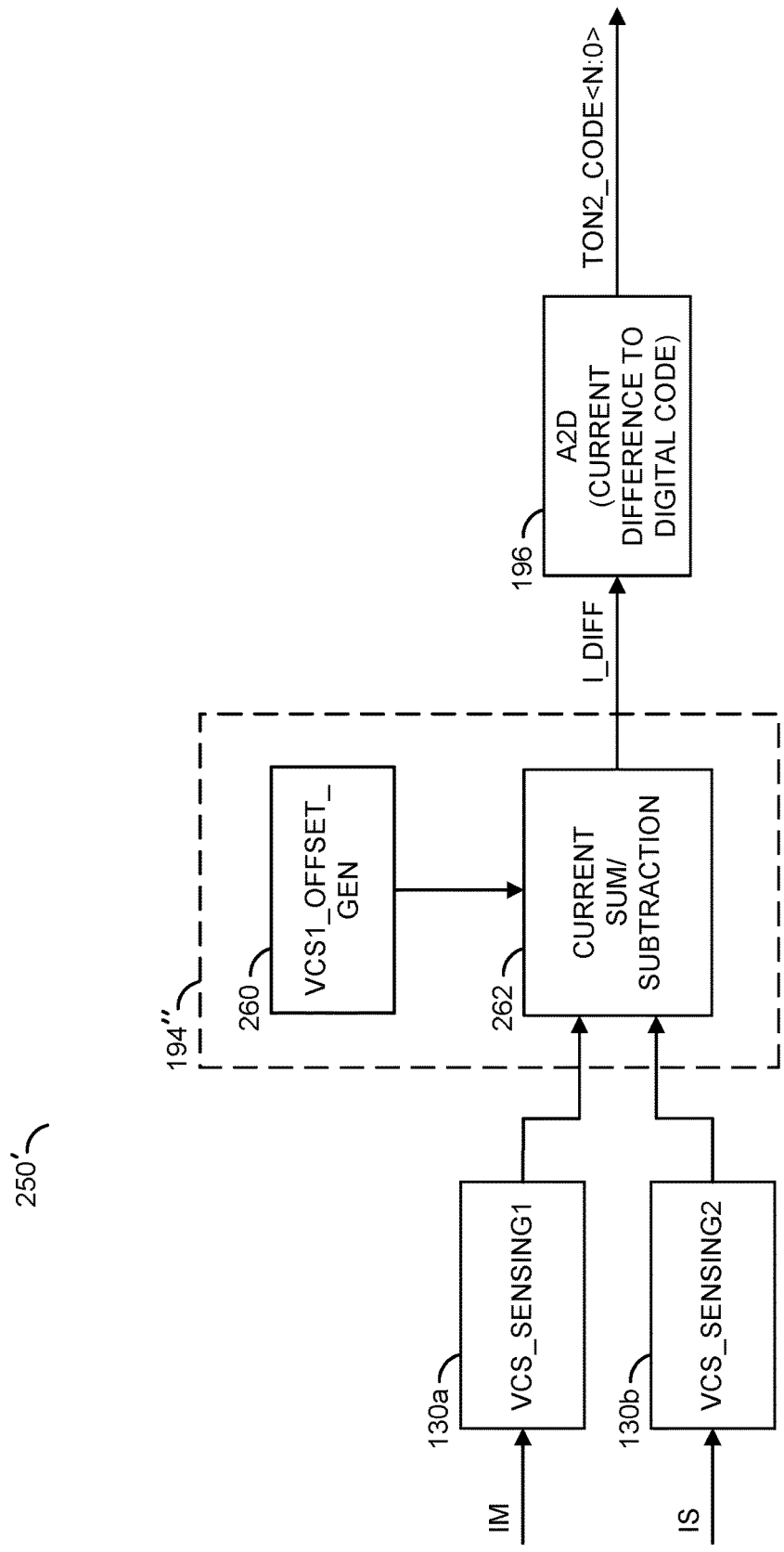
FIG. 7 is a diagram illustrating an alternate example implementation of current balancing.

Referring to FIG. 7, a diagram illustrating an alternate example implementation 250' of current balancing is shown. The example implementation 250' may implement one method (e.g., an offset method) for performing the current balancing and/or tuning operations. Other methods may be implemented by the apparatus 100 to perform the current balancing. The method of current balancing may be varied according to the design criteria of a particular implementation.

The example current balancing implementation 250' may comprise the current sensing circuits 130a-130b, the current balance calculation circuit 194" and/or the current difference digital code circuit 196. In the example shown, the current sensing circuit 130a may receive the inductor current IM, the current sensing circuit 130b may receive the inductor current IS and the current difference digital code circuit 196 may present the signal TON2_CODE<N:0>.

The current balance calculation circuit 194" may comprise a block (or circuit) 260 and/or a block (or circuit) 262. The circuit 260 may implement an offset generator circuit. The circuit 262 may be a current summation circuit. The current balance calculation circuit 194" may comprise other components (not shown). The number, type and/or arrangement of the components of the current balance calculation circuit 194" may be varied according to the design criteria of a particular implementation.

The offset generator 260 may know the phase delay T_PHASE and/or a known slope of the inductor current IM (e.g., based on a value of the inductor current IM at the time T_PHASE and the maximum current value IM_MAX). The offset generator circuit 260 may be configured to determine an offset between the maximum current value IM_MAX and the slave current IS at a time when the slave current is at a maximum (e.g., after a time T_PHASE from the maximum current value IM_MAX is detected) to get the value IS_MAX. During the decision window, the current summation circuit 262 may compare the master inductor current IM with the value IS_MAX in real-time (e.g., perform the current sensing comparison).

Figure 8:
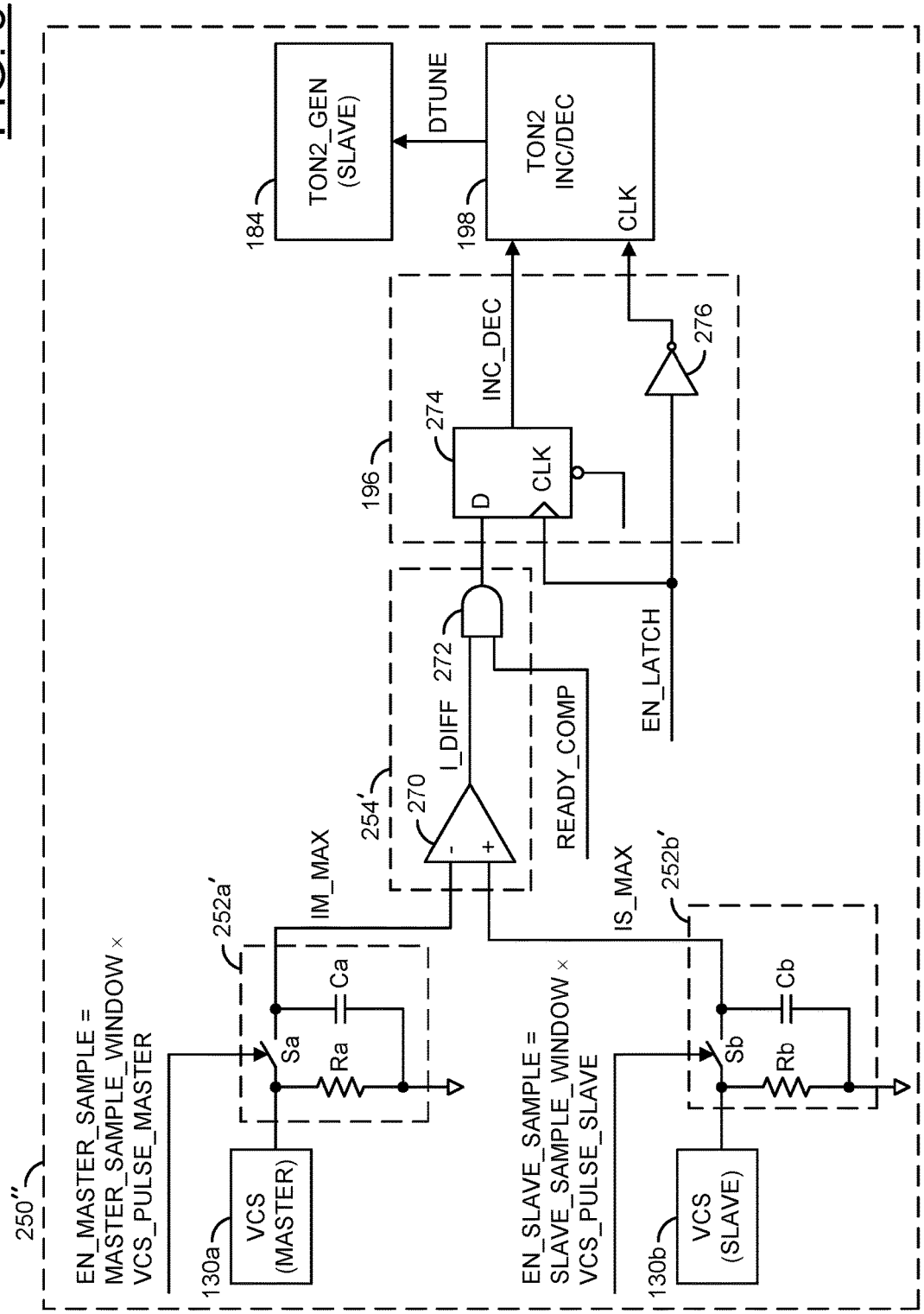
FIG. 8 is a diagram illustrating an example topology for generating an ON time for the slave circuit.

During the decision window, with the known offset for the master current IM, the current summation circuit 262 may generate the current difference (e.g., the signal I_DIFF). The current difference digital code circuit 196 may generate the signal TON2_CODE<N:0> based on the phase difference (e.g., based on the signal I_DIFF). The signal TON2_CODE<N:0> may be an incremental or decremental digital code used by the dynamic tuning circuit 198 to generate the signal DTUNE (e.g., for the next ON time TON2). Referring to FIG. 8, a diagram illustrating an example topology 250" for generating an ON time for the slave circuit 104 is shown. The example topology 250" may be an example topology to implement the sample and hold current comparison method described in association with FIG. 6. The example topology 250" may comprise the current sensing circuits 130a-130b, the sample and hold circuits 252a'-252b', the summation circuit 254', the current difference digital code circuit 196, the dynamic tuning circuit 198 and/or the generator circuit 184. The example topology 250" may comprise other components (not shown). The number, type and/or arrangement of the components of the example topology 250" may be varied according to the design criteria of a particular implementation.

The sample and hold circuit 252a' may comprise a switch (e.g., Sa), a resistor (e.g., Ra) and/or a capacitor (e.g., Ca). Similarly, the sample and hold circuit 252b' may comprise a switch (e.g., Sb), a resistor (e.g., Rb) and/or a capacitor (e.g., Cb). Closing the switches Sa-Sb may enable the respective combination of resistors Ra-Rb and/or capacitors Ca-Cb to sample and hold the respective maximum current (e.g., the maximum current IM_MAX for the sample and hold circuit 252a' and the maximum current IS_MAX for the sample and hold circuit 252b'). The signal SAMPLE_VCS1 may control the switch Sa. The signal SAMPLE_VCS1 may have a sample window for the master circuit 102 defined by EN_MASTER_SAMPLE=MASTER_SAMPLE_WINDOW× VCS_PULSE_MASTER. The signal SAMPLE_VCS2 may control the switch Sb. The signal SAMPLE_VCS2 may have a sample window for the slave circuit 104 defined by EN_SLAVE_SAMPLE=SLAVE_SAMPLE_WINDOW× VCS_PULSE_SLAVE.

The summation circuit 254' may comprise a comparator 270 and/or a logic gate 272. A negative input of the comparator 270 may receive the maximum master current value IM_MAX (e.g., generated by the sample and hold circuit 252a'). A positive input of the comparator 270 may receive the maximum slave current value IS_MAX (e.g., generated by the sample and hold circuit 252b'). The comprator 270 may determine the current difference and generate the signal I_DIFF. The signal I_DIFF may be presented to a first input of the logic gate 272. A second input of the logic gate 272 may receive a signal (e.g., READY_COMP). The signal READY_COMP may be implemented to enable a comparison. For example, the logic gate may perform a logical AND operation to pass through the current difference comparison signal IDIFF when the signal READY_COMP is asserted.

The current difference digital code circuit 196 may comprise a flip-flop 274 and/or a logic gate 276. In an example, the flip-flop 274 may be a D flip-flop. The current difference digital code circuit 196 may receive the signal I_DIFF and/or a signal (e.g., EN_LATCH). The signal I_DIFF may be received by a D input of the flip-flop 274. The signal EN_LATCH may be presented to a clock input of the flip-flop 274. An output of the flip-flop 274 may present a signal (e.g., INC_DEC). The logic gate 276 may perform a logical NOT operation on the signal EN_LATCH. The signal INC_DEC and the inverted signal EN_LATCH (e.g., together the signal TON2_CODE<N:0>) may be presented to the dynamic tuning circuit 198.

The dynamic tuning circuit 298 may receive the signal INC_DEC. The inverted signal EN_LATCH may be received by a clock input of the dynamic tuning circuit 298. The dynamic tuning circuit 298 may be configured to generate the signal DTUNE in response to the signal INC_DEC and/or the inverted signal EN_LATCH. The dynamic tuning circuit 298 may present the signal DTUNE to the generator circuit 284.

Figure 9:
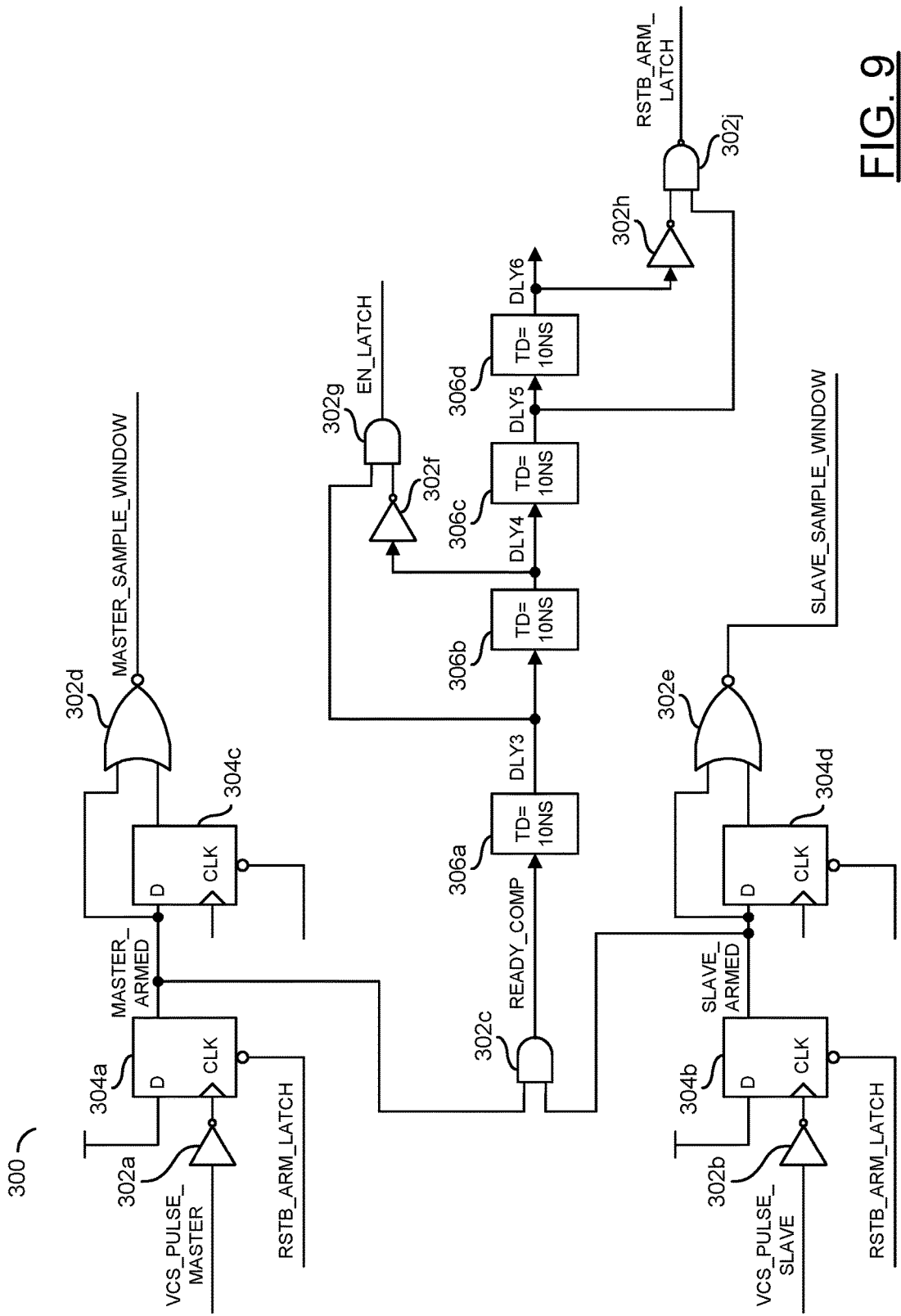
FIG. 9 is a diagram illustrating an example control logic topology.

Referring to FIG. 9, a diagram illustrating an example control logic topology 300 is shown. The control logic topology 300 may be an example topology to implement control logic for the sample and hold current comparison method described in association with FIG. 6. The control logic topology 300 may be configured to generate the signal MASTER_SAMPLE_WINDOW, the signal EN_LATCH, the signal SLAVE_SAMPLE_WINDOW (e.g., each shown in association with FIG. 8) and/or a signal (e.g., RSTB_ARM_LATCH). The control logic topology 300 may receive the signal VCS_PULSE_MASTER and/or the signal VCS_PULSE_SLAVE.

The control logic topology 300 may comprise blocks (or circuits) 302a-302j, blocks (or circuits) 304a-304d and/or blocks (or circuits) 306a-306d. The circuits 302a-302j may implement digital logic circuitry. For example, the circuits 302a-302j may comprise logical AND gates, logical NAND gates, logical NOR gates, logical NOT gates and/or equivalent circuits. The circuits 304a-304d may implement flip-flop circuits (e.g., D flip-flops). The circuits 306a-306d may implement delay circuits. In the example shown, the delay circuits 306a-306d may be operational to perform a 10 ns delay. The control logic topology 300 may comprise other components (not shown). The number, type and/or arrangement of the components of the control logic topology 300 may be varied according to the design criteria of a particular implementation.

The logic gate 302a may receive the signal VCS_PULSE_MASTER. The logic gate 302a may perform a logical NOT operation. The inverted signal VCS_PULSE_MASTER may be presented to a clock input of the flip-flop 304a. A D input of the flip-flop 304a may receive an input. A reset input of the flip-flop 304a may receive the signal RSTB_ARM_LATCH. The flip-flop 304a may present a signal (e.g., MASTER_ARMED). The signal MASTER_ARMED may be presented to a D input of the flip-flop 304c, a first input of the logic gate 302d and/or a first input of the logic gate 302c.

The inverted signal VCS_PULSE_MASTER may be presented to a clock input of the flip-flop 304c. The D input of the flip-flop 304c may receive the signal MASTER_ARMED. A reset input of the flip-flop 304c may receive the signal RSTB_ARM_LATCH. The flip-flop 304c may present an output to a second input of the logic gate 302d. The logic gate 302d may be configured to perform a logical NOR operation on the signal MASTER_ARMED and the output of the flip-flop 304c. An output of the logic gate 302d may be the signal MASTER_SAMPLE_WINDOW.

The logic gate 302b may receive the signal VCS_PULSE_SLAVE. The logic gate 302b may perform a logical NOT operation. The inverted signal VCS_PULSE_SLAVE may be presented to a clock input of the flip-flop 304b. A D input of the flip-flop 304b may receive an input. A reset input of the flip-flop 304b may receive the signal RSTB_ARM_LATCH. The flip-flop 304b may present a signal (e.g., SLAVE_ARMED). The signal SLAVE_ARMED may be presented to a D input of the flip-flop 304d, a first input of the logic gate 302e and/or a second input of the logic gate 302c.

The inverted signal VCS_PULSE_SLAVE may be presented to a clock input of the flip-flop 304d. The D input of the flip-flop 304d may receive the signal SLAVE_ARMED. A reset input of the flip-flop 304d may receive the signal RSTB_ARM_LATCH. The flip-flop 304d may present an output to a second input of the logic gate 302e. The logic gate 302e may be configured to perform a logical NOR operation on the signal SLAVE_ARMED and the output of the flip-flop 304d. An output of the logic gate 302e may be the signal SLAVE_SAMPLE_WINDOW.

The logic gate 302c may receive the signal MASTER_ARMED at the first input and the signal SLAVE_ARMED at the second input. The logic gate 302c may perform a logical AND operation. The output of the logic gate 302c may be a signal (e.g., READY_COMP). The delay circuit 306a may receive the signal READY_COMP. The delay circuit 306a may perform a delay operation and/or generate a signal (e.g., DLY3). The signal DLY3 may be presented to a first input of the logic gate 302g and/or an input of the delay circuit 306b.

The delay circuit 306b may receive the circuit DLY3. The delay circuit 306b may perform a delay operation and/or present an output signal (e.g., DLY4). The signal DLY4 may be presented to an input of the logic gate 302f. The logic gate 302f may perform a logical NOT operation on the signal DLY4. The logic gate 302f may present the inverted signal DLY4 to a second input of the logic gate 302g. The logic gate 302g may be configured to perform a logical AND operation on the signal DLY3 and the inverted signal DLY4. The logic gate 302g may generate the output signal EN_LATCH.

The delay circuit 306c may receive the signal DLY4. The delay circuit 306c may perform the delay operation and/or generate a signal (e.g., DLY5). The signal DLY5 may be presented to a second input of the logic gate 302j and/or the input of the delay circuit 306d. The delay circuit 306d may receive the signal DLY5. The delay circuit 306d may perform the delay operation and/or generate a signal (e.g., DLY6). The signal DLY6 may be presented to an input of the logic gate 302h and/or as an output of the control logic topology 300. The logic gate 302h may be configured to perform a logical NOT operation on the signal DLY6. The signal DLY6 may be presented to a first input of the logic gate 302j. The logic gate 302j may be configured to perform a logical NAND operation on the inverted signal DLY6 and the signal DLY5. The logical gate 302j may be configured to generate the signal RSTB_ARM_LATCH.

Figure 10:
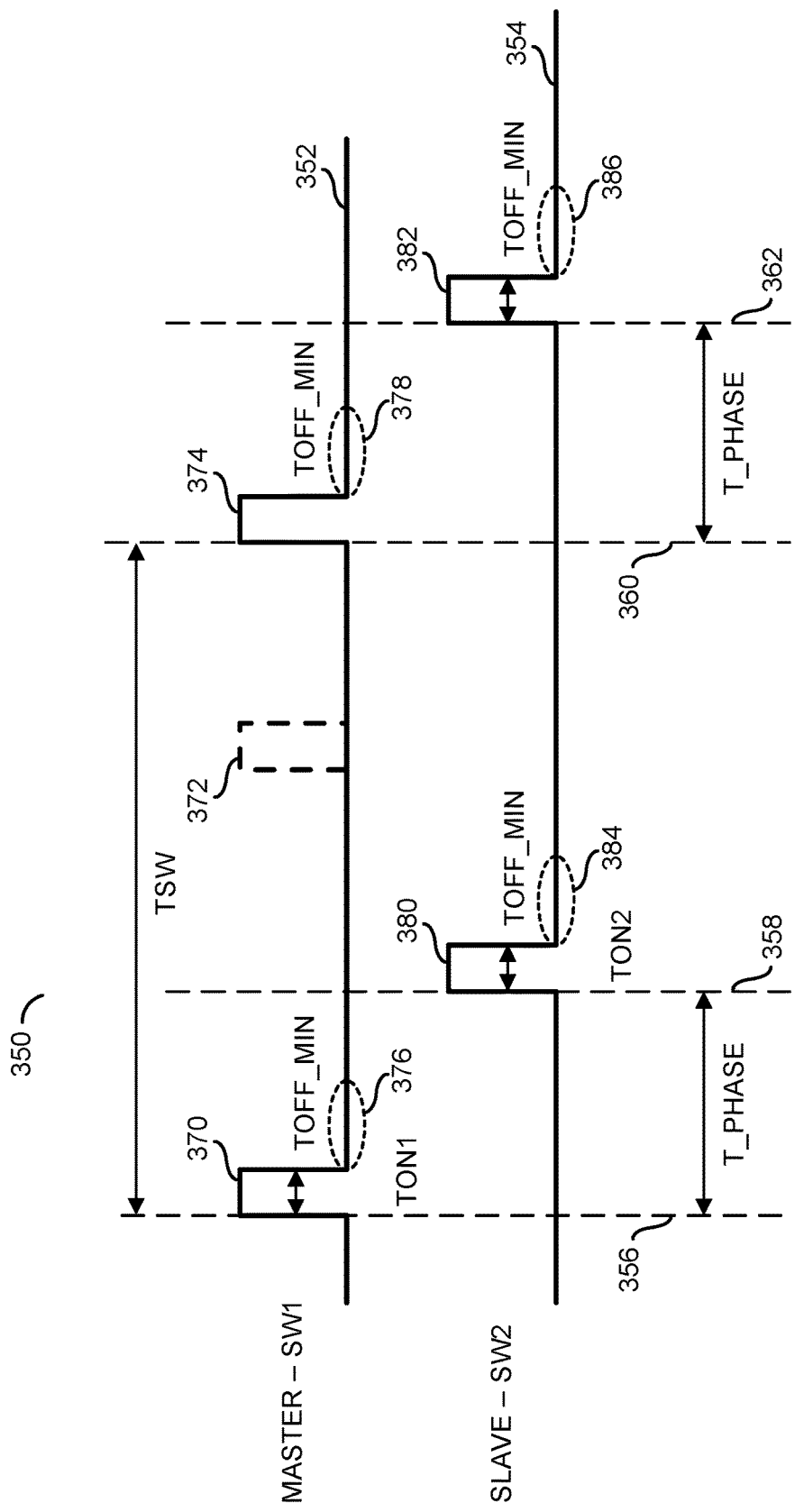
FIG. 10 is a timing diagram illustrating an automatic phase-shift for a load step down transient condition.

Referring to FIG. 10, a timing diagram 350 illustrating an automatic phase-shift for a load step down transient condition is shown. The timing graph 350 may comprise a waveform 352 and/or a waveform 354. The waveform 352 may be a representation of the master output signal VMO. The waveform 354 may be a representation of the slave output signal VSO. A line 356, a line 358, a line 360 and/or a line 362 are shown. A distance between the line 356 and the line 358 may represent an amount of time corresponding to the phase delay T_PHASE. A distance between the line 360 and the line 362 may represent the amount of time corresponding to the phase delay T_PHASE.

A pulse 370, a pulse 372 and/or a pulse 374 are shown on the master waveform 352. The pulse 370 may represent a first ON time TON1. The ON time 370 may start at the time corresponding to the line 356. The pulse 372 is shown as a dotted line. The dotted pulse 372 may represent an expected second ON time for the master waveform 352 (e.g., after the phase delay T_PHASE when there is no transient condition on the load 50). The pulse 374 may represent a second ON time for the master waveform 352. The ON time 374 may start at the time corresponding to the line 360. A region 376 and a region 378 are shown. The region 376 may represent an amount of time for a minimum amount of OFF time (e.g., TOFF1) corresponding to the first ON time 370. The region 378 may represent an amount of time for a minimum amount of OFF time (e.g., TOFF1) corresponding to the second ON time 374.

A pulse 380 and/or a pulse 382 are shown on the slave waveform 354. The pulse 380 may represent a first ON time TON2 for the slave waveform 354. The ON time 372 may start at the time corresponding to the line 358 (e.g., after the phase delay T_PHASE from the start of the ON time 370). The pulse 382 may represent a second ON time for the slave waveform 354. The ON time 382 may start at the time corresponding to the line 362 (e.g., after the phase delay T_PHASE from the start of the ON time 374). A region 384 and a region 386 are shown. The region 384 may represent an amount of time for a minimum amount of OFF time (e.g., TOFF2) corresponding to the first ON time 380. The region 384 may represent an amount of time for a minimum amount of OFF time (e.g., TOFF2) corresponding to the second ON time 382.

The apparatus 100 may be configured to perform an automatic phase shift for a fast load transient response. When the transient condition occurs on the load 50, the master circuit 102 may keep the ON time TON1, and may adjust the OFF time TOFF1 to catch the changes on the load 50. When the transient conditions for the load 50 are a step down condition, the OFF time TOFF1 may be increased. For example, the phase difference between the master output signal VMO and the slave output signal VSO may be less than 180 degrees. The apparatus 100 may be configured to automatically shift to 180 degrees when the load 50 is stable.

The master circuit 102 may automatically extend the OFF time TOFF1 to catch the transient condition on the load 50. In the example shown, the pulse 372 may be shown at a time representing the next ON time under stable conditions and the pulse 374 may represent the delayed ON time in response to the extended OFF time. The slave circuit 104 may engage the ON time TON2 after the phase delay T_PHASE. The slave circuit 104 may automatically extend the corresponding OFF time TOFF2 following the master circuit 102.

The width of the ON time TON1 may be based on VOUT/VIN (e.g., similar to a traditional COT) to ensure a switch frequency. A period (e.g., TSW) may be an amount of time between the start of the pulse 370 and the start of the pulse 372 (e.g., two times T_PHASE during normal operation). The phase delay T_PHASE may be determined based on the ON time TON1 of the master circuit 102, the input voltage VIN and/or the output voltage VOUT (e.g., to enable a 180 degree phase shift). To ensure regulation, the master circuit 102 may initiate the pulse 370 when VFB<VREF (with ramp compensation). The current sensing comparison window may occur between the pulse 380 and the pulse 382 (e.g., to predict the next ON time TON2 for the slave circuit 104). The width of the ON time TON2 may be determined by starting with the width of the ON time TON1 and/or digitally incrementing and decrementing the width based on the current balancing results (e.g., based on the signal DTUNE).

The width of the ON time TON1 may be determined based on an equation (e.g., TON1=k*RON*CON*VOUT/VIN). The period TSW may be determined based on an equation (e.g., TSW=k*RON*CON). The phase delay T_PHASE may be determined based on an equation (e.g., T_PHASE=½*TSW=½*TON1*VIN/VOUT=½*k*RON* CON). The value k may be a constant coefficient selected based on getting a desired ON time value with a particular capacitor (e.g., CON) and resistor (e.g., RON).

The value TOFF1 of the master circuit 102 may be adjusted to catch the changes on the load 50. For the apparatus 100 to initialize an ON pulse multiple conditions may be satisfied. One condition may be that the inductor current (e.g., IM and/or IS) may not be over a current limit. Another condition may be that the output voltage VOUT may drop below a threshold value. When the condition of the load 50 is a step high condition, the output voltage VOUT may drop faster to the threshold value, which may result in a shorter TOFF1 value for the master circuit 102 than in the steady state. When the condition of the load 50 is a step low condition, the output voltage VOUT may drop slower to the threshold value, which may result in a longer TOFF1 value for the master circuit 102 than in the steady state.

Figure 11:
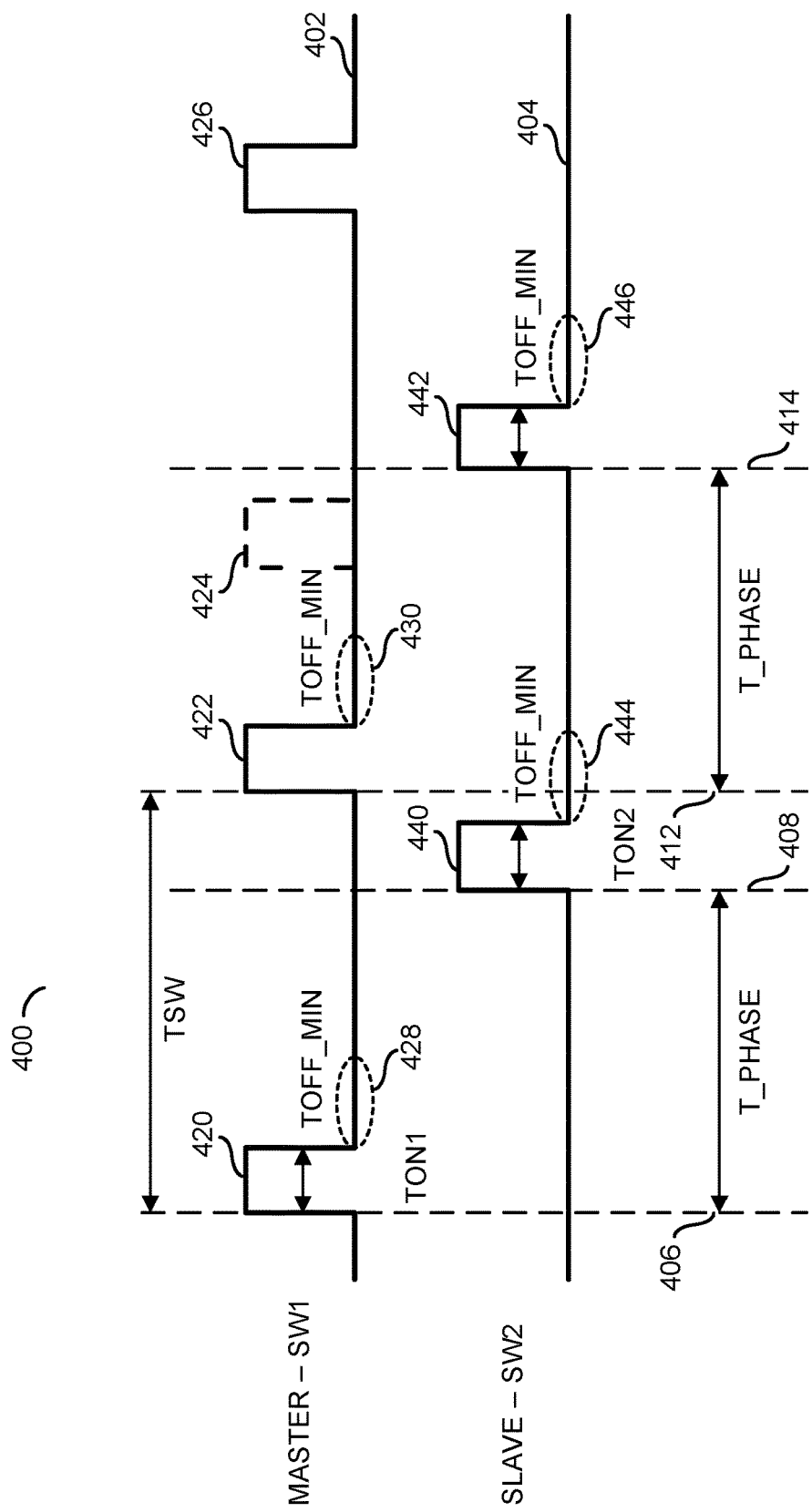
FIG. 11 is a timing diagram illustrating an automatic phase-shift for a gentle load step up transient condition.

Referring to FIG. 11, a timing diagram 400 illustrating an automatic phase-shift for a gentle load step up transient condition is shown. The timing graph 400 may comprise a waveform 402 and/or a waveform 404. The waveform 402 may be a representation of the master output signal VMO. The waveform 404 may be a representation of the slave output signal VSO. A line 406, a line 408, a line 412 and/or a line 414 are shown. A distance between the line 406 and the line 408 may represent an amount of time corresponding to the phase delay T_PHASE. A distance between the line 412 and the line 414 may represent the amount of time corresponding to the phase delay T_PHASE.

A pulse 420, a pulse 422, a pulse 424 and/or a pulse 426 are shown on the master waveform 402. The pulse 420 may represent a first ON time TON1. The ON time 420 may start at the time corresponding to the line 406. The pulse 422 may represent a second ON time for the master waveform 402. The ON time 422 may start at the time corresponding to the line 412. The pulse 424 is shown as a dotted line. The dotted pulse 424 may represent an expected second ON time for the master waveform 402 (e.g., when there is no transient condition on the load 50). A region 428 and a region 430 are shown. The region 428 may represent an amount of time for a minimum amount of OFF time (e.g., TOFF1) corresponding to the first ON time 420. The region 430 may represent an amount of time for a minimum amount of OFF time (e.g., TOFF1) corresponding to the second ON time 422.

A pulse 440 and/or a pulse 442 are shown on the slave waveform 404. The pulse 440 may represent a first ON time TON2 for the slave waveform 404. The ON time 440 may start at the time corresponding to the line 408 (e.g., after the phase delay T_PHASE from the start of the ON time 420). The pulse 442 may represent a second ON time for the slave waveform 404. The ON time 442 may start at the time corresponding to the line 414 (e.g., after the phase delay T_PHASE from the start of the ON time 422). A region 444 and a region 446 are shown. The region 444 may represent an amount of time for a minimum amount of OFF time (e.g., TOFF2) corresponding to the first ON time 440. The region 446 may represent an amount of time for a minimum amount of OFF time (e.g., TOFF2) corresponding to the second ON time 442.

A step up condition may occur on the load 50. Depending on the slew rate of the load transient, a number of scenarios may occur. In a first scenario (e.g., case 1), the transient conditions on the load 50 may not be fast (e.g., the load change is not sharp). When the transient conditions on the load 50 are not fast, the following ON time TON1 may be after the phase delay T_PHASE has finished (e.g., as shown in association with FIG. 10). In a second scenario (e.g., case 2), the transient conditions on the load 50 may be fast enough. When the transient conditions on the load 50 are fast enough, the following ON time TON1 may be earlier than the end of the phase delay T_PHASE from the pulse 440 (e.g., as shown in association with FIG. 11). In a third scenario (e.g., case 3), the transient conditions on the load 50 may be extremely fast. When the transient conditions on the load 50 are extremely fast, the voltage VOUT may drop below 98% of the regulation voltage.

The ON time TON2 may start when T_PHASE has finished (e.g., at the line 408). The phase difference between the master circuit 102 and the slave circuit 104 may be greater than 180 degrees. The current sensing circuits 130a-130b and/or the current balance calculation circuit 194 may finish a sample and hold operation during the region 424 (e.g., during TOFF_MIN for TON1) and/or finish the comparison during the region 444 (e.g., at the TOFF_MIN after the ON time TON2) to determine the inductor current difference. Once the transient condition on the load 50 settles down, the master circuit 102 and/or the slave circuit 104 may automatically enter the steady state (e.g., with a 180 degree phase difference between the waveform 402 and the waveform 404).

In the example shown, a distance (e.g., TSW) between the first pulse 420 and the second pulse 422 (e.g., the line 406 and the line 412) is smaller than a distance (e.g., TSW) between the first pulse 370 and the second pulse 374 (e.g., the line 356 and the line 360 shown in association with FIG. 10). For example, for the waveform 352, the second ON time 374 occurs after the expected second ON time 372 and for the waveform 402, the second ON time 422 occurs before the expected second ON time 424.

Figure 12:
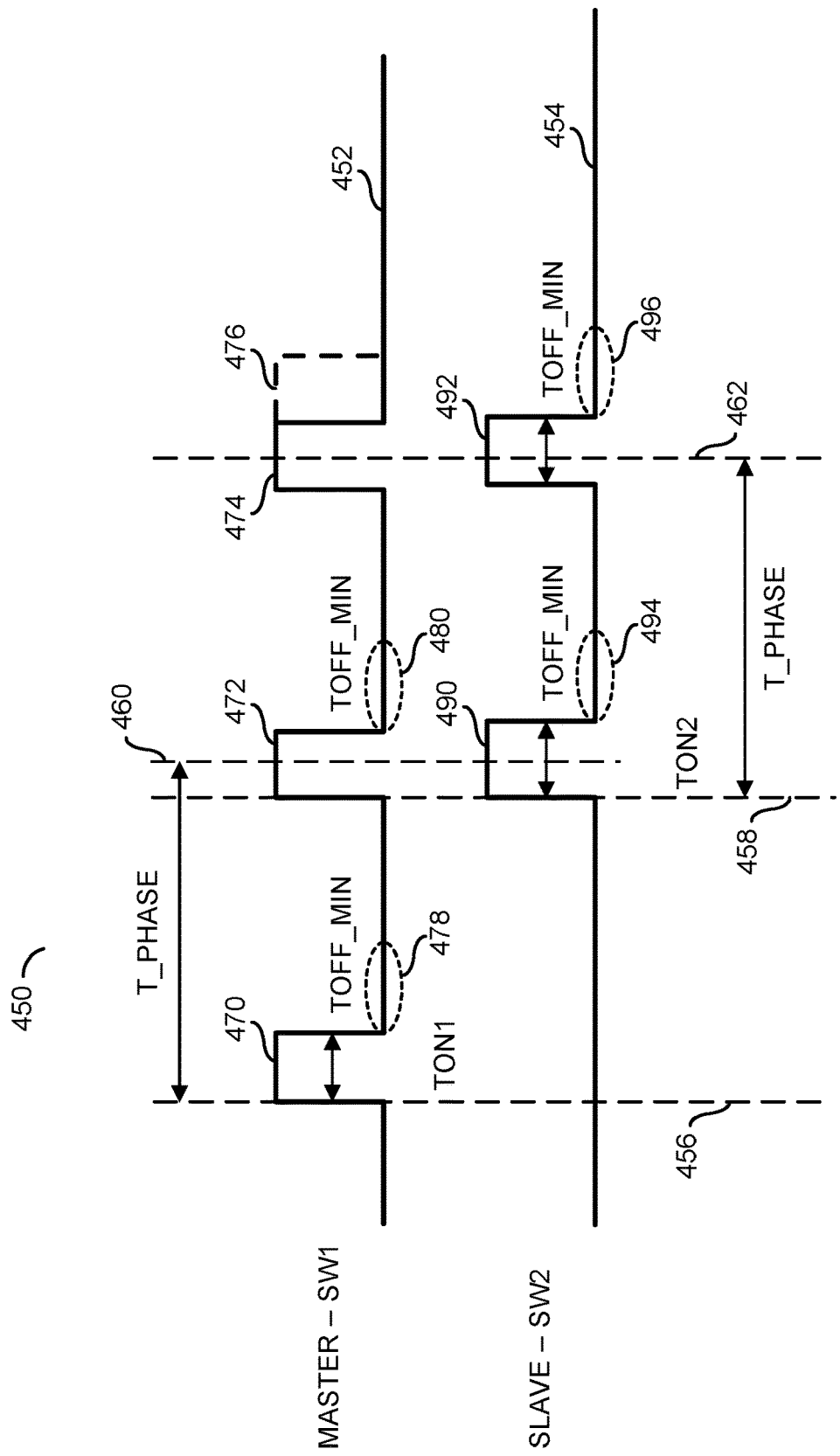
FIG. 12 is a timing diagram illustrating an automatic phase-shift for a fast load step up transient condition.

Referring to FIG. 12, a timing diagram 450 illustrating an automatic phase-shift for a fast load step up transient condition is shown. The timing graph 450 may comprise a waveform 452 and/or a waveform 454. The waveform 452 may be a representation of the master output signal VMO. The waveform 454 may be a representation of the slave output signal VSO. A line 456, a line 458, a line 460 and/or a line 462 are shown. A distance between the line 456 and the line 460 may represent an amount of time corresponding to an expected phase delay T_PHASE. A distance between the line 458 and the line 462 may represent the amount of time corresponding to the phase delay T_PHASE.

A pulse 470, a pulse 472, a pulse 474 and/or a pulse 476 are shown on the master waveform 452. The pulse 470 may represent a first ON time TON1. The ON time 470 may start at the time corresponding to the line 456. The pulse 472 may represent a second ON time for the master waveform 452. The ON time 472 may start at the time corresponding to the line 458. The pulse 474 may represent a third ON time for the master waveform 452. The pulse 476 is shown as a dotted line. The dotted pulse 476 may represent an expected second ON time for the master waveform 452 (e.g., when there is no transient condition on the load 50). A region 478 and a region 480 are shown. The region 478 may represent an amount of time for a minimum amount of OFF time (e.g., TOFF1) corresponding to the first ON time 470. The region 480 may represent an amount of time for a minimum amount of OFF time (e.g., TOFF1) corresponding to the second ON time 472.

A pulse 490 and/or a pulse 492 are shown on the slave waveform 454. The pulse 490 may represent a first ON time TON2 for the slave waveform 454. The ON time 490 may start at the time corresponding to the line 458 (e.g., before the phase delay T_PHASE from the start of the ON time 470). The pulse 492 may represent a second ON time for the slave waveform 454. The ON time 492 may start before the time corresponding to the line 462 (e.g., after the phase delay T_PHASE from the start of the ON time 472). A region 494 and a region 496 are shown. The region 494 may represent an amount of time for a minimum amount of OFF time (e.g., TOFF2) corresponding to the first ON time 490. The region 496 may represent an amount of time for a minimum amount of OFF time (e.g., TOFF2) corresponding to the second ON time 492.

The waveform 452 and/or the waveform 454 may be representative of the scenario when the change on the load 50 are very sharp. The ON time 490 (e.g., TON2 of the slave circuit 104) may start at the same time as the second ON time 472 (e.g., TON1 of the master circuit 102). For example, the master circuit 102 and the slave circuit 104 may provide synchronized switching. The current sensing circuits 130a-130b and/or the current balance calculation circuit 194 may initiate a sample and hold operation during the region 478 (e.g., during TOFF_MIN for TON1 470) and/or finish the comparison during the region 494 (e.g., at the TOFF_MIN after the ON time TON2 490). Once the transient condition on the load 50 settles down, the following TON1 474 may happen after the phase delay T_PHASE has finished. Then the apparatus 100 may enter the condition described in association with FIG. 11 (e.g., a gentle load step up case), then smoothly shift to the steady state condition. In the example shown, a distance (e.g., TSW) between the first pulse 470 and the second pulse 472 (e.g., the line 456 and the line 458) is smaller than a distance (e.g., TSW) between the first pulse 420 and the second pulse 422 (e.g., the line 406 and the line 412 shown in association with FIG. 11).

Figure 13:
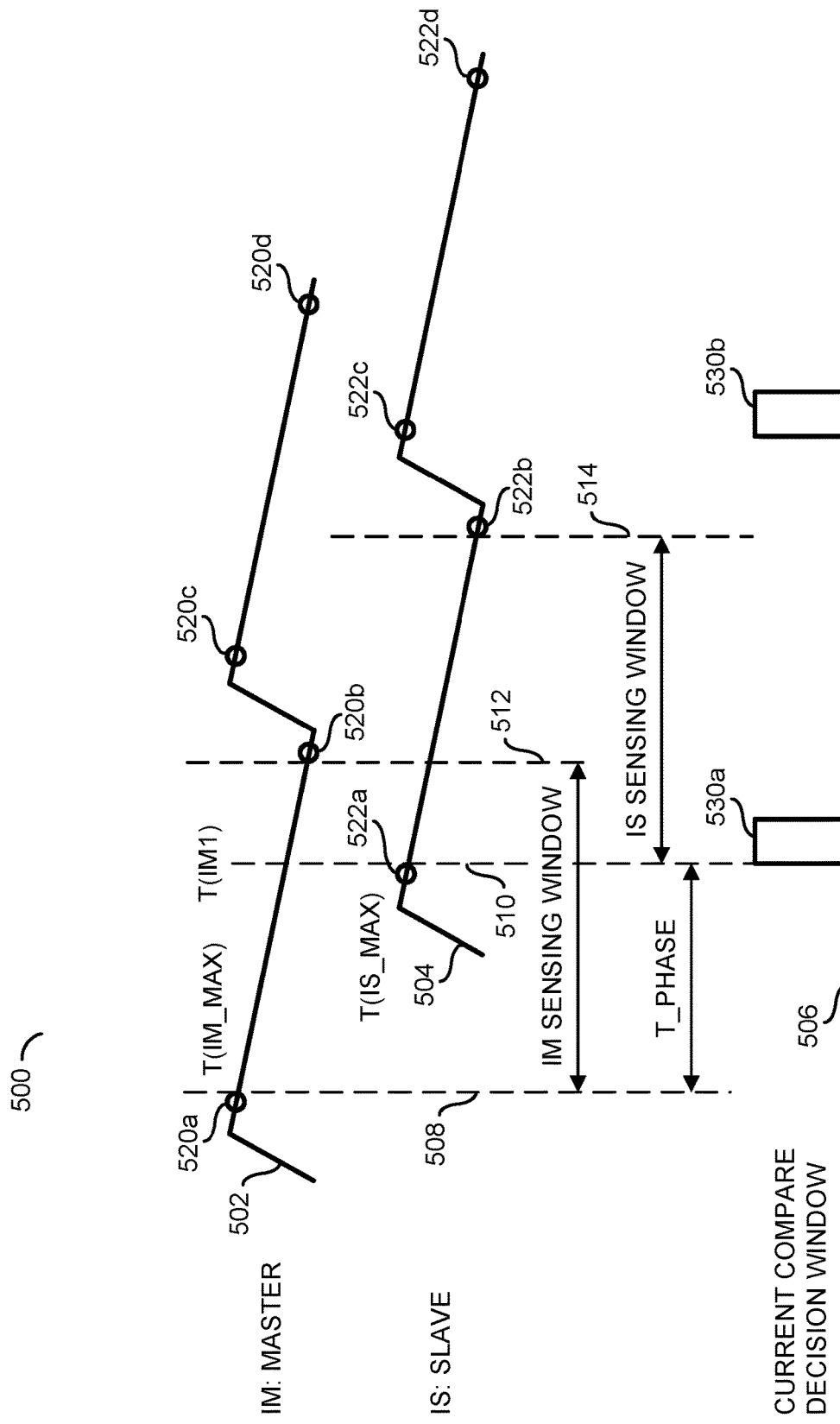
FIG. 13 is a timing diagram illustrating an example multi-phase constant ON time current balancing.

Referring to FIG. 13, a timing diagram 500 illustrating an example multi-phase constant ON time current balancing is shown. A waveform 502, a waveform 504 and/or a waveform 506 are shown. The waveform 502 may represent the master current IM. The waveform 504 may represent the slave current IS. The waveform 506 may represent the current compare decision window. The waveform 502 and/or the waveform 504 may be analyzed to determine the phase difference using the current sensing circuit 130a-130b and/or the current balance calculation circuit 194, as shown in association with FIG. 6.

A vertical line 508, a vertical line 510, a vertical line 512 and/or a vertical line 514 are shown. A distance between the line 508 and the line 510 may represent an amount of time corresponding to the phase delay T_PHASE. A distance between the line 508 and the line 512 may represent an amount of time corresponding to a current sensing window for the signal IM. A distance between the line 510 and the line 514 may represent an amount of time corresponding to a current sensing window for the signal IS.

A number of points 520a-520d are shown on the waveform 502. A number of points 522a-522d are shown on the waveform 504. The point 520a may generally correspond with the line 508. The point 520a may represent a maximum current of the signal IM (e.g., IM_MAX) during the current sensing window for the signal IM. The point 520b may represent a current at the end of the current sensing window for the signal IM (e.g., corresponding to the line 512). The point 522a may represent a maximum current of the signal IS (e.g., IS_MAX) during a current sensing window for the signal IS. The point 522b may represent a current at the end of the current sensing window for the signal IS. A current (e.g., IM1) is shown at a time corresponding to the IS_MAX value (e.g., at the time corresponding to the line 510). The points 520c-520d and/or the points 522c-522d may provide similar representations for a next cycle of the signal IM and/or IS.

In some embodiments, the apparatus 100 may be configured to perform the sample and hold method for multi-phase current balancing (e.g., shown in association with FIG. 6). During the sensing window for the current IM (e.g., between the line 508 and the line 512), the apparatus 100 may sample the maximum master current IM_MAX at the time corresponding to the point 520a. During the sensing window for the current IS (e.g., between the line 510 and the line 514), the apparatus 100 may sample the maximum slave current IS_MAX at the time corresponding to the point 522a. The maximum master current IM_MAX may be held by the sample and hold circuit 252a and the maximum slave current IS_MAX may be held by the sample and hold circuit 252b. During the current compare decision window 530a, the summation circuit 254 may compare the maximum master current IM_MAX and the maximum slave current IS_MAX and get the phase difference (e.g., I_DIFF). In response to the inductor current difference I_DIFF, the current difference digital code circuit 196 may generate incremental and/or decremental digital code(s) for the next ON time TON2 for the slave circuit 104.

In some embodiments, the apparatus 100 may be configured to perform the offset method for multi-phase current balancing (e.g., shown in association with FIG. 7). During the sensing window for the signal IM (e.g., between the line 508 and the line 512), the apparatus 100 may determine a slope of the signal IM. During the sensing window for the current IS (e.g., between the line 510 and the line 514), the apparatus 100 may determine a slope of the signal IS. Since the phase delay T_PHASE is known, the apparatus 100 may determine an offset between the maximum master current IM_MAX and the current IS at the time 510 may be known. The circuit 260 and/or the circuit 262 may be configured to compare the current IM and the maximum slave current IS_MAX in real time using the known offset for the current IM to calculate the inductor current difference during the decision window 530a. The current difference digital code circuit 196 may generate incremental and/or decremental digital code(s) for the next ON time TON2 for the slave circuit 104.

A value of the change in the current IM may be determined based on an equation (e.g., D_IM=[VOUT*T_PHASE]/L=½*[k*RON*CON*VOUT]/L). A value of the current IS may be determined based on an equation (e.g., IS=[IM*Rds]/Rs=IM/n). The value of the change in the current IS may be determined based on an equation (e.g., DIS=½*1/n*[k*RON*CON*VOUT]/L). The change in the slave output voltage VSO may be determined based on an equation (e.g., VSO=½*1/n*[k*RN*RON*CON*VOUT]/L).

Figure 14:
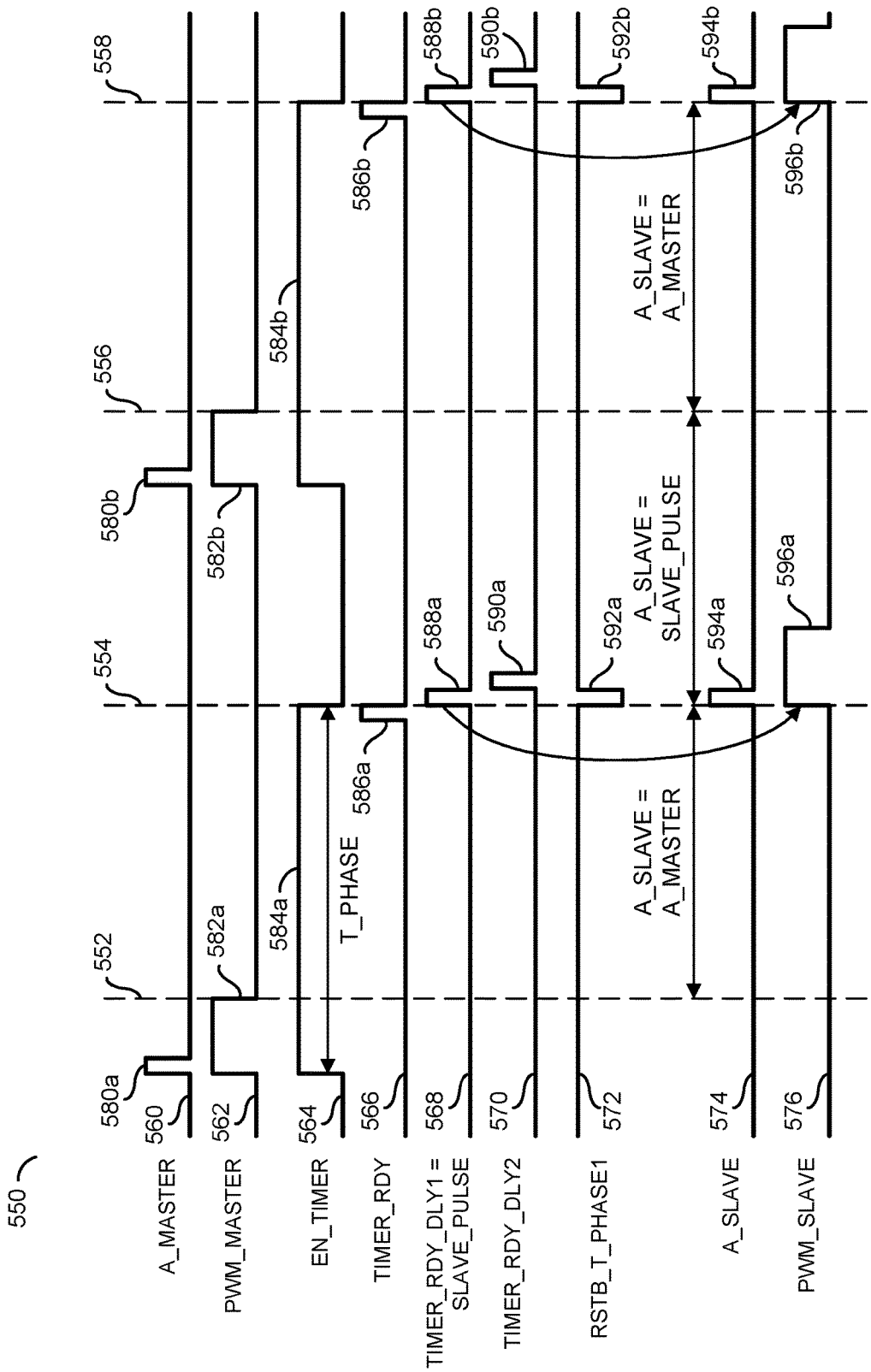
FIG. 14 is a timing diagram illustrating control timing for a steady state load condition.

Referring to FIG. 14, a timing diagram 550 illustrating control timing for a steady state load condition is shown. A waveform 560, a waveform 562, a waveform 564, a waveform 566, a waveform 568, a waveform 570, a waveform 572, a waveform 574 and/or a waveform 576 are shown. The waveform 560 may correspond to the signal A_MASTER. The waveform 562 may correspond to the signal PWM_MASTER. The waveform 564 may correspond to the signal EN_TIMER. The waveform 566 may correspond to the signal TIMER_RDY. The waveform 568 may correspond to the signal TIMER_RDY_DLY1 (e.g., DLY1 and/or SLAVE_PULSE). The waveform 570 may correspond to the signal TIMER_RDY_DLY2 (e.g., DLY2). The waveform 572 may correspond to the signal RSTB_T_PHASE1. The waveform 574 may correspond to the signal A_SLAVE. The waveform 576 may correspond to the signal PWM_SLAVE.

A vertical line 552, a vertical line 554, a vertical line 556 and/or a vertical line 558 are shown. As shown in association with FIG. 5 (e.g., the output of the multiplexer 230), the signal A_SLAVE may correspond to the signal SLAVE_PULSE and/or the signal A_MASTER. During a time between the line 552 and the line 554, the signal A_SLAVE may be equal to the signal A_MASTER. During a time between the line 554 and the line 556, the signal A_SLAVE may be equal to the signal SLAVE_PULSE. During a time between the line 556 and the line 558, the signal A_SLAVE may be equal to the signal A_MASTER.

The waveform 560 is shown having pulses 580a-580b. The waveform 562 is shown having pulses 582a-582b. The waveform 564 is shown having pulses 584a-584b. The waveform 566 is shown having pulses 586a-586b. The waveform 568 is shown having pulses 588a-588b. The waveform 570 is shown having pulses 590a-590b. The waveform 572 is shown having pulses 592a-592b. The waveform 574 is shown having pulses 594a-594b. The waveform 576 is shown having pulses 596a-596b.

In the example shown, the phase delay T_PHASE is shown as the width of the pulse 584a of the signal EN_TIMER. In the example shown, pulse 588a of the signal SLAVE_PULSE may have the same start time (e.g., corresponding to the line 554) as the pulse 596a of the signal PWM_SLAVE.

To perform the auto-phase shift, during normal conditions (e.g., steady state at the load 50), after the signal PWM_MASTER has been asserted, the signal A_MASTER may keep low until the T_PHASE timer (e.g., the signal EN_TIMER) has finished. The signal PWM_SLAVE may engage after the signal EN_TIMER is done (e.g., at the line 554). After the signal EN_TIMER has finished, a reset pulse may be generated to reset the timer (e.g., the pulse 592a on the signal RSTB_T_PHASE1). For example, the signal A_SLAVE may not be able to wake up the signal PWM_SLAVE if the slave current IS is triggered and/or stays.

Figure 15:
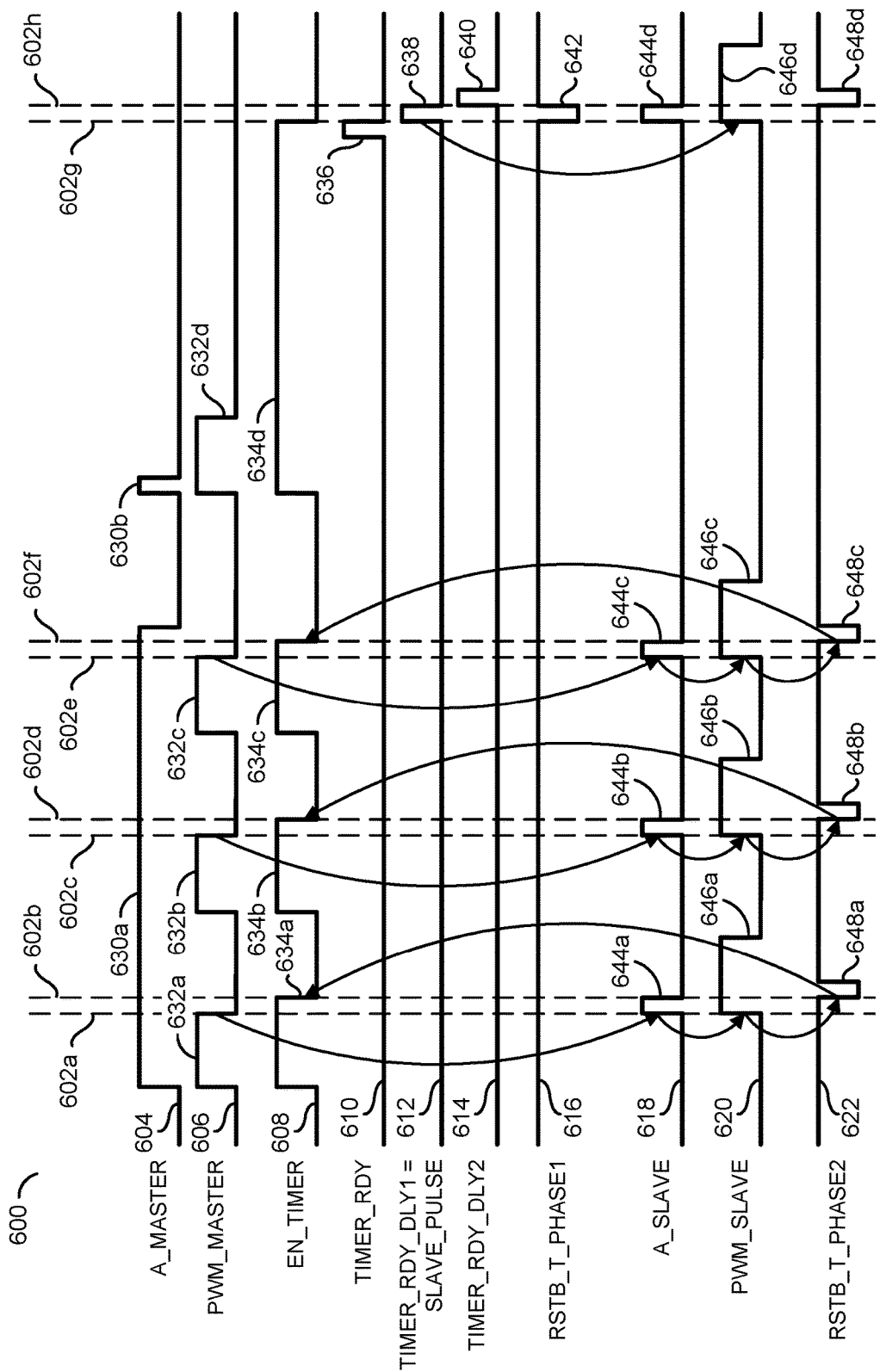
FIG. 15 is a timing diagram illustrating control timing for a high step load condition.

Referring to FIG. 15, a timing diagram 600 illustrating control timing for a high step load condition is shown. Vertical lines 602a-602h are shown. A waveform 604, a waveform 606, a waveform 608, a waveform 610, a waveform 612, a waveform 614, a waveform 616, a waveform 618, a waveform 620 and/or a waveform 622 are shown. The waveform 604 may correspond to the signal A_MASTER. The waveform 606 may correspond to the signal PWM_MASTER. The waveform 608 may correspond to the signal EN_TIMER. The waveform 610 may correspond to the signal TIMER_RDY. The waveform 612 may correspond to the signal TIMER_RDY_DLY1 (e.g., the signal DLY1 and/or SLAVE_PULSE). The waveform 614 may correspond to the signal TIMER_RDY_DLY2 (e.g., the signal DLY2). The waveform 616 may correspond to the signal RSTBT_PHASE1. The waveform 618 may correspond to the signal A_SLAVE. The waveform 620 may correspond to the signal PWM_SLAVE. The waveform 622 may correspond to the signal RSTB_T_PHASE2.

The waveform 604 is shown having pulses 630a-630b. For example the pulse 630a may be a long pulse and the pulse 630b may be a short pulse. The waveform 606 is shown having pulses 632a-632d. The waveform 608 is shown having pulses 634a-634d. The pulse 634d may be longer than the pulses 634a-634c. The waveform 610 is shown having a pulse 636. The waveform 612 is shown having a pulse 638. The waveform 614 is shown having a pulse 640. The waveform 616 is shown having a pulse 642. The waveform 618 is shown having pulses 644a-644d. The waveform 620 is shown having pulses 646a-646d. The waveform 622 is shown having the pulses 648a-648d.

The lines 602a-602b may represent a width of the pulse 644a of the signal A_SLAVE. The lines 602c-602d may represent a width of the pulse 644b of the signal A_SLAVE. The lines 602e-602f may represent a width of the pulse 644c of the signal A_SLAVE. The lines 602g-602h may represent a width of the pulse 644d of the signal A_SLAVE. The pulses 632a-632c may end at the start of the pulses 644a-644c (e.g., for example, at the time 602a, the time 602c and the time 602e). The pulses 646a-646c of the signal PWM_SLAVE may be asserted at the start of the pulses 644a-644c (e.g., for example, at the time 602a, the time 602c and the time 602e). The pulses 648a-648c of the signal RSTB_T_PHASE2 may be asserted at the same time as the falling edge of the pulses 634a-634c of the signal EN_TIMER (e.g., for example, at the time 602b, the time 602d, the signal 602f). The pulse 638, the pulse 642, the pulse 644d and the pulse 646d may be asserted at the time 602g. The pulse 640 and the pulse 648d may be asserted at the time 602h.

To perform the auto-phase shift in response to the load step high conditions at the load 50, after the signal PWM_MASTER has been asserted, the signal A_MASTER may keep high (or be asserted back to high) before the T_PHASE timer (e.g., the signal EN_TIMER) has finished. When the signal PWM_MASTER is equal to logical 0 (or a logical low value) and the signal EN_TIMER is equal to a logical 1 (or a logical high value), the signal A_SLAVE may be the same as the signal A_MASTER to enable a fast response. Once a logical high value is detected on the signal A_SLAVE, one of the pulses 646a-646d of the signal PWM_SLAVE may be engaged (if the current IS is equal to 0). The present value of the signal PWM_SLAVE may generate a reset pulse to the T_PHASE timer.

Figure 16:
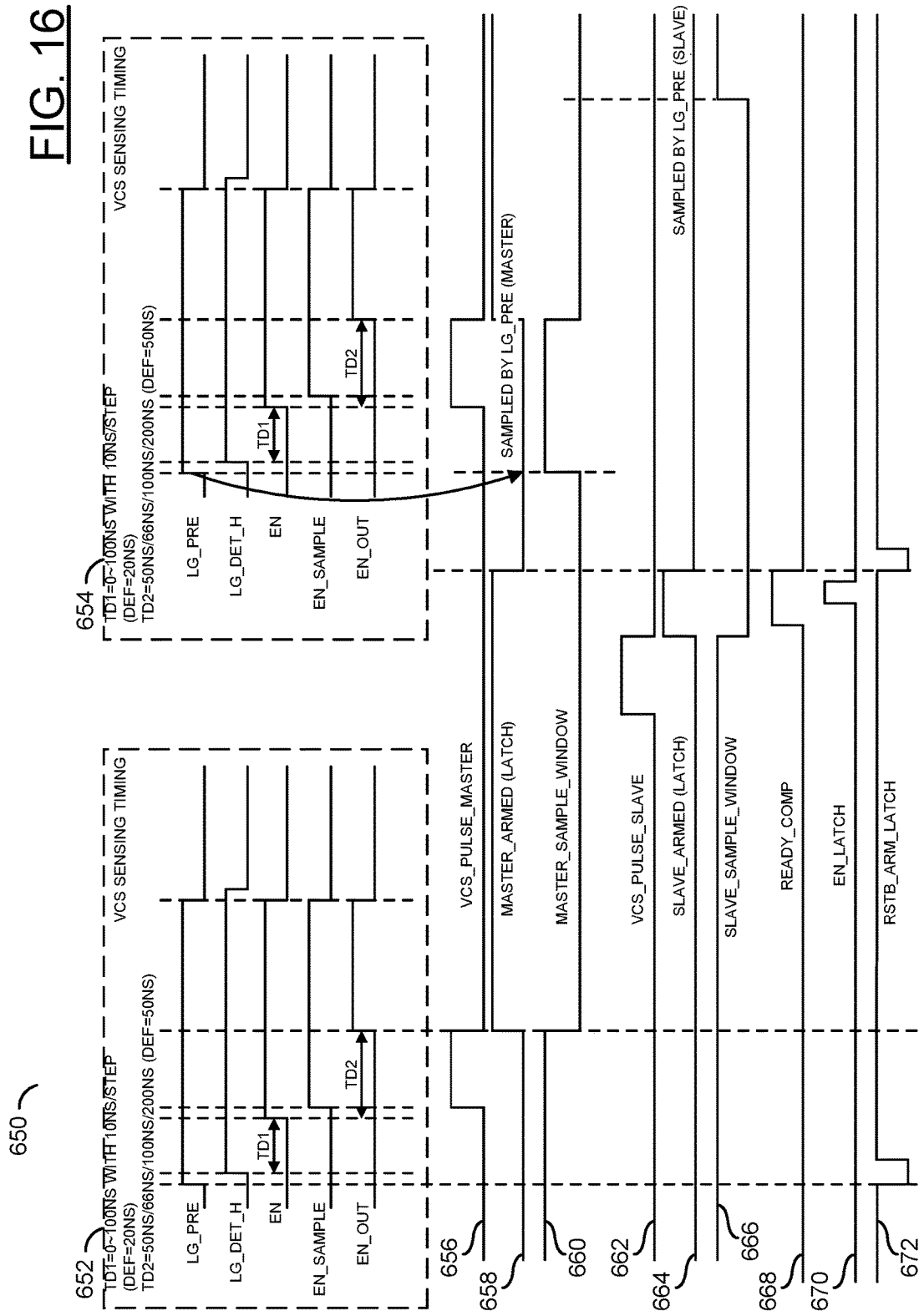
FIG. 16 is a timing diagram illustrating a timing sequence for current balancing.

Referring to FIG. 16, a timing diagram 650 illustrating timing sequence for current balancing is shown. The timing diagram 650 may be the timing sequence for the sample and hold method of current balancing described in association with FIG. 6.

A group of signals 652 are shown. The group of signals 652 may comprise signals (e.g., LG_PRE, LG_DET_H, EN, EN_SAMPLE and/or EN OUT). A group of signals 654 are shown. The group of signals 654 may be the same signals as in the group of signals 652 corresponding to a later time.

A waveform 656, a waveform 658, a waveform 660, a waveform 662, a waveform 664, a waveform 666, a waveform 668, a waveform 670 and/or a waveform 672 are shown. The waveform 656 may represent the signal VCS_PULSE_MASTER. The waveform 658 may represent the signal MASTER_ARMED (LATCH). The waveform 660 may represent the signal MASTER_SAMPLE_WINDOW. The waveform 662 may represent the signal VCS_PULSE_SLAVE. The waveform 664 may represent the signal SLAVE_ARMED (LATCH). The waveform 666 may represent the signal SLAVE_SAMPLE_WINDOW. The waveform 668 may represent the signal READY_COMP. The waveform 670 may represent the signal EN_LATCH. The waveform 672 may represent the signal RSTB_ARM_LATCH.

When the waveform 660 (e.g., MASTER_SAMPLE_WINDOW) is at a logical high value, to perform the inductor current comparison sample and hold method, the master inductor current IM may be sampled when the waveform 656 (e.g., VCS_PULSE_MASTER) is a logical high value. Once the sample and hold is complete (e.g., performed by the circuit 252a), the master side may be armed by asserting the signal MASTER_ARMED to a logical high value. In the example shown, after the negative transition of the waveform 656, the waveform 658 may have a positive transition. The waveform 658 at logical high may indicate that the sample and hold for the master circuit 102 is ready.

When the waveform 666 (e.g., SLAVE_SAMPLE_WINDOW) is at a logical high value, to perform the inductor current comparison sample and hold method, the slave inductor current IS may be sampled when the waveform 662 (e.g., VCS_PULSE_SLAVE) is a logical high value. Once the sample and hold is complete (e.g., performed by the circuit 252b), the slave side may be armed by asserting the signal SLAVE_ARMED to a logical high value. In the example shown, after the negative transition of the waveform 662, the waveform 664 may have a positive transition. The waveform 664 at a logical high may indicate that the sample and hold for the slave circuit 104 is ready.

When both armed signals (e.g., the waveform 658 and the waveform 664) are asserted at a logical high value, the waveform 668 (e.g., READY_COMP) may be asserted to a logical high value. When the waveform 668 is a logical high value, the current difference comparison may be performed (e.g., by the circuit 254). The comparison result (e.g., I_DIFF) may be latched with the waveform 670 (e.g., EN_LATCH) asserted to a logical high value. The inductor current difference comparison may be finished after the latch activity with the waveform 666 returns to a logical low value. The armed conditions (e.g., the waveform 658 and the waveform 664) may each be reset with a logical low pulse of the waveform 672 (e.g., RSTB_ARM_LATCH).

Figure 17:
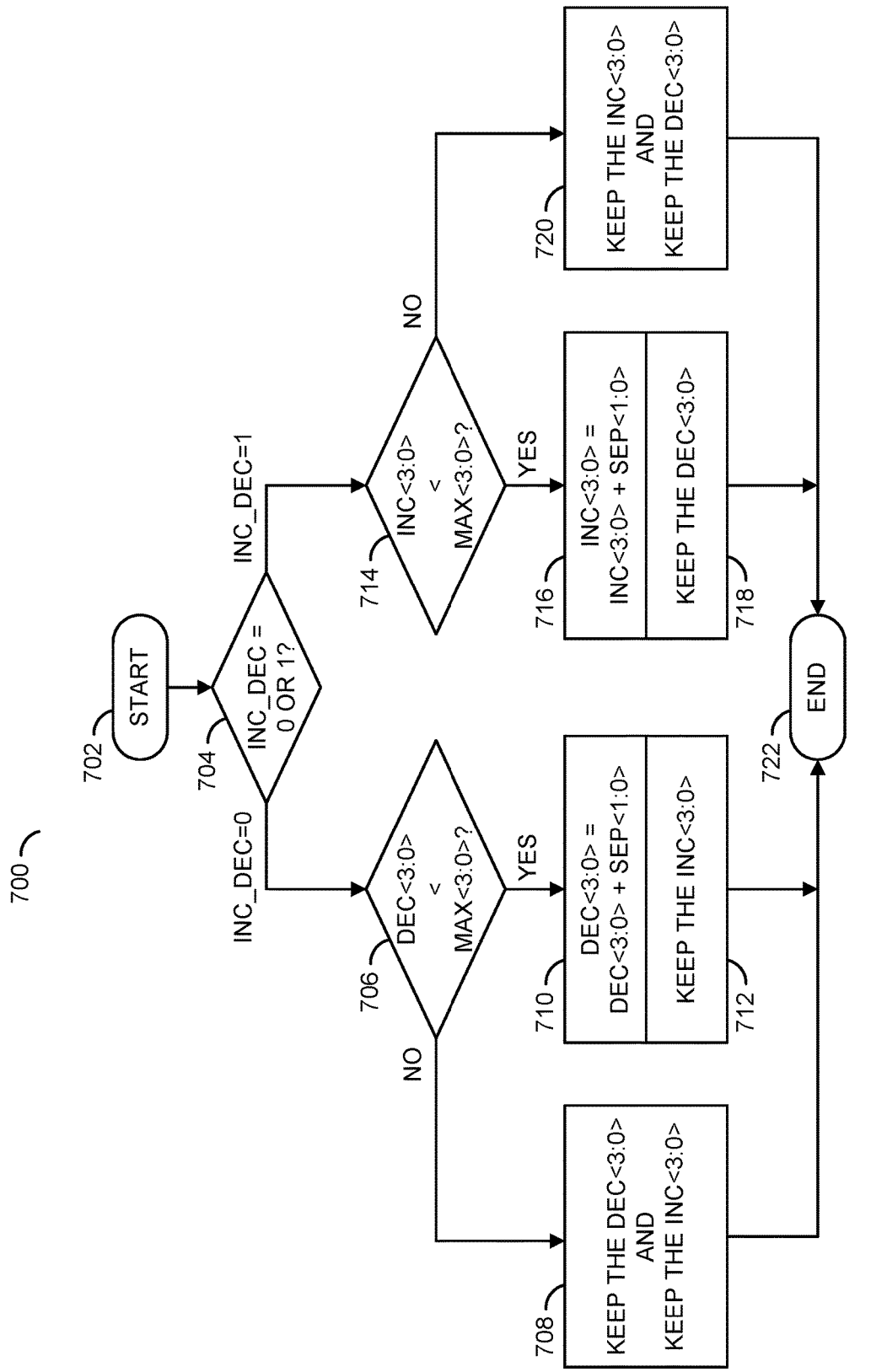
FIG. 17 is a flow diagram illustrating a method for incrementally adjusting an ON time of the slave circuit.

Referring to FIG. 17, a method (or process) 700 is shown. The method 700 may incrementally adjust an ON time of the slave circuit 104 using sample and hold. The method 700 generally comprises a step (or state) 702, a decision step (or state) 704, a decision step (or state) 706, a step (or state) 708, a step (or state) 710, a step (or state) 712, a decision step (or state) 714, a step (or state) 716, a step (or state) 718, a step (or state) 720, and a step (or state) 722.

The state 702 may start the method 700. Next, the method 700 may move to the decision state 704. In the decision state 704, the dynamic tuning circuit 198 may determine whether the signal INC_DEC has a value of 0 or 1. For example, the flip-flop 274 may generate the signal INC_DEC in response to the phase difference signal I_DIFF (shown in association with FIG. 8). If the signal INC_DEC has a value of 0, the method 700 may move to the decision state 706.

In the decision state 706, the dynamic tuning circuit 198 may determine whether a decrement value (e.g., DEC<3:0>) is less than a maximum value (e.g., MAX<3:0>). If the decrement value is not less than the maximum value, the method 700 may move to the state 708. In the state 708, the dynamic tuning circuit 198 may keep the decrement value DEC<3:0> and/or keep an increment value (e.g., INC<3:0>). Next, the method 700 may move to the state 722.

In the decision state 706, if the decrement value is less than the maximum value, the method 700 may move to the state 710. In the state 710, the dynamic tuning circuit 198 may adjust (e.g., digitally) the decrement value DEC<3:0> based on a value (e.g., SEP<1:0>). In an example, the previous decrement value may be increased by the value (e.g., DEC<3:0>=DEC<3:0>+SEP<1:0>). Next, in the state 712, the dynamic tuning circuit 198 may keep the increment value INC<3:0>. Next, the method 700 may move to the state 722.

In the decision state 704, if the signal INC_DEC has a value of 1, the method 700 may move to the decision state 714. In the decision state 714, the dynamic tuning circuit 198 may determine whether the increment value INC<3:0> is less than the maximum value MAX<3:0>. If the increment value is less than the maximum value, the method 700 may move to the state 716. In the state 716, the dynamic tuning circuit 198 may adjust (e.g., digitally) the increment value INC<3:0> based on the value SEP<1:0>. In an example, the previous increment value may be increased by the value (e.g., INC<3:0>=INC<3:0>+SEP<1:0>). Next, in the state 718, the dynamic tuning circuit 718 may keep the decrement value DEC<3:0>. Next, the method 700 may move to the state 722.

In the decision state 714, if the dynamic tuning circuit 198 determines that the increment value is not less than the maximum value, the method 700 may move to the state 720. In the state 720, the dynamic tuning circuit 198 may keep the increment value INC<3:0> and/or keep the decrement value DEC<3:0> (e.g., no digital adjustment performed). Next, the method 700 may move to the state 722. The state 722 may end the method 700.

The value DEC, the value INC the value MAX and/or the value SEP may each be customized parameters. For example, a designer of the apparatus 100 may limit a tuning range and/or tuning speed. The tuning range may be limited by the MAX value and/or a MIN value. The tuning speed may be limited by the SEP value. The value of INC_DEC may be determined by the current difference digital code circuit 196 and presented as the input to the dynamic tune circuit 198 (shown in association with FIG. 8).

Figure 18:
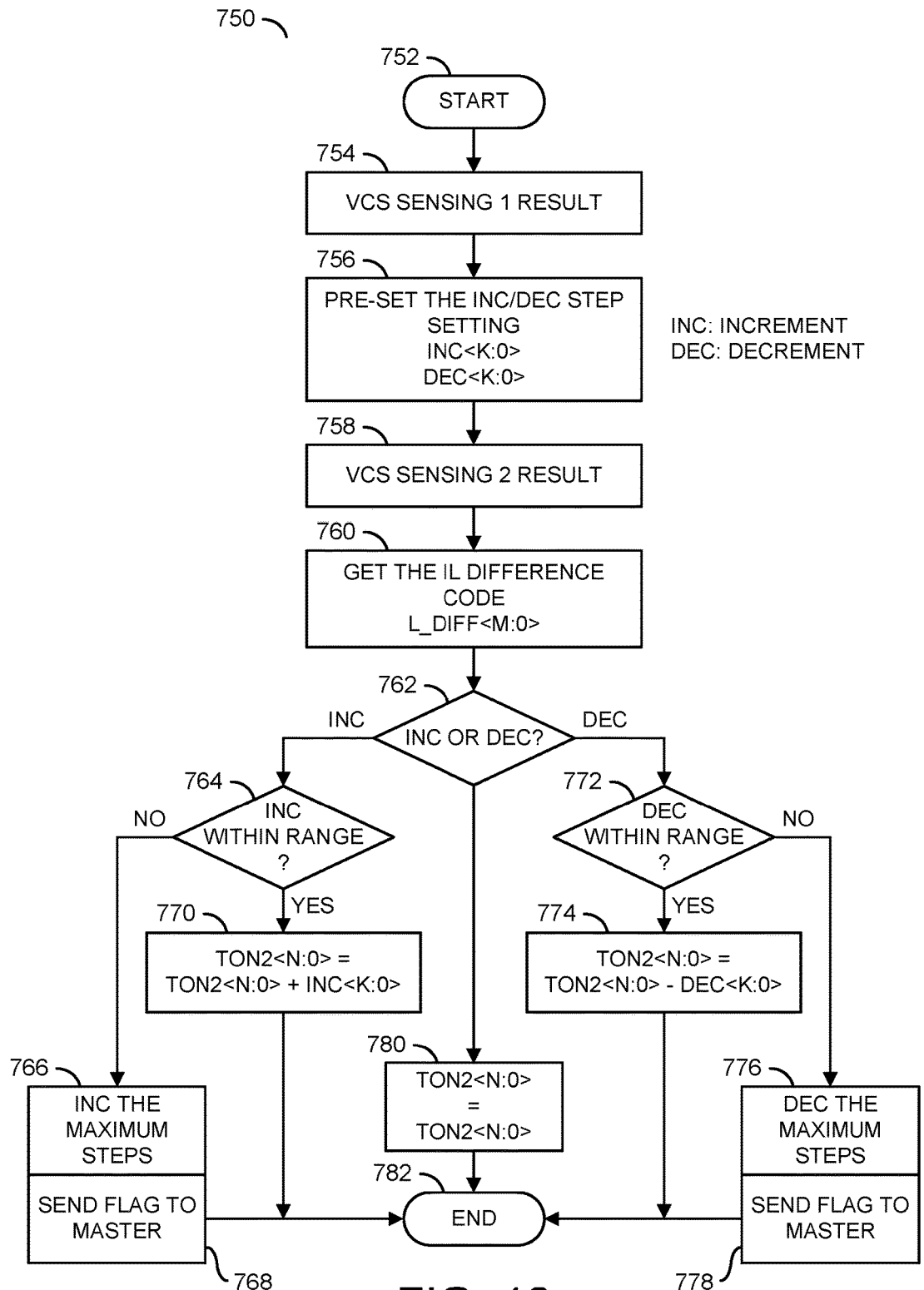
FIG. 18 is a flow diagram illustrating a method for dynamically tuning an ON time of the slave circuit.

Referring to FIG. 18, a method (or process) 750 is shown. The method 750 may dynamically tune an ON time of the slave circuit 104. The method 750 generally comprises a step (or state) 752, a step (or state) 754, a step (or state) 756, a step (or state) 758, a step (or state) 760, a decision step (or state) 762, a decision step (or state) 764, a step (or state) 766, a step (or state) 768, a step (or state) 770, a decision step (or state) 772, a step (or state) 774, a step (or state) 776, a step (or state) 778, a step (or state) 780, and a step (or state) 782.

The state 752 may start the method 750. In the state 754, the current sensing circuit 130a may determine the VCS sensing result (e.g., the maximum master current value IM_MAX). Next, in the state 756, the dynamic tuning circuit 198 may pre-set the increment/decrement step size setting (e.g., the amount of the digital adjustment). For example, the increment value may be set to INC<K:0> and the decrement value may be set to DEC<K:0>, where K represents the step setting. Next, in the state 758, the current sensing circuit 130b may determine the VCS sensing result (e.g., the maximum slave current value IS_MAX). In the state 760, the current balance calculation circuit 194 may determine a phase difference code (e.g., I_DIFF<M:0>). The phase difference signal I_DIFF may be presented to the current difference digital code circuit 196. Next, the method 750 may move to the decision state 762.

In the decision state 762, the current difference digital code circuit 196 may determine whether to increment, decrement or hold the value of the signal TON2_CODE<N:0>. For example, whether to increment, decrement or hold the signal TON2_CODE<N:0> may be determined based on the phase difference code signal I_DIFF<M:0>. If the current difference digital code circuit 196 determines to increment, the method 750 may move to the decision state 764.

In the decision state 764, the current difference digital code circuit 196 may determine whether the signal INC<K:0> is within range. For example, there may be a maximum and minimum value of the signal TON2<N:0> and as TON2<N:0> is increased/decreased the signal TON2<N:0> may reach a maximum/minimum boundary. If the signal INC<K:0> is not within range, the method 750 may move to the state 766. In the state 766, the dynamic tuning circuit 198 may increment the maximum number of steps. Next, in the state 768, the dynamic tuning circuit 198 may send a flag to the master circuit 102. The flag may be a notification to the master circuit 102 that the tuning of the slave circuit 104 has reached a maximum range. Next, the method 750 may move to the state 782.

In the decision state 764, if the signal INC<K:0> is within range, the method 750 may move to the state 770. In the state 770, the current difference digital code circuit 196 may increment the signal TON2_CODE<N:0>. For example, the signal TON2_CODE<N:0> may provide a code to the dynamic tuning circuit 198 to increment the ON time TON2 of the slave circuit 104 (e.g., TON2<N:0>=TON2<N:0>+INC<K:0>). Next, the method 750 may move to the state 782.

In the decision state 762, if the current difference digital code circuit 196 determines to decrement, the method 750 may move to the decision state 772. In the decision state 772, the current difference digital code circuit 196 may determine whether the signal DEC<K:0> is within range. If the signal DEC<K:0> is within range, the method 750 may move to the state 774. In the state 774, the current difference digital code circuit 196 may decrement the signal TON2_CODE<N:0>. For example, the signal TON2_CODE<N:0> may provide a code to the dynamic tuning circuit 198 to decrement the ON time TON2 of the slave circuit 104 (e.g., TON2<N:0>=TON2<N:0>−DEC<K:0>). Next, the method 750 may move to the state 782.

In the decision state 772, if the signal DEC<K:0> is not within range, the method 750 may move to the state 776. In the state 776, the dynamic tuning circuit 198 may decrement the maximum number of steps. Next, in the state 778, the dynamic tuning circuit 198 may send a flag to the master circuit 102. Next, the method 750 may move to the state 782.

In the decision state 762, if the current difference digital code circuit 196 determines to hold the value of the signal TON2_CODE<N:0>, the method 750 may move to the state 780. In the state 780, the current difference digital code circuit 196 may keep the previous digital code value (e.g., TON2_CODE<N:0>=TON2_CODE<N:0>). Next, the method 750 may move to the state 782. The state 782 may end the method 750.

The functions performed by the diagrams of FIGS. 1-18 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

Although embodiments of the invention have been described in the context of a DDR4 and/or DDR5 application, the present invention is not limited to DDR4 and/or DDR5 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a first circuit configured to (a) generate an output signal with a regulated voltage and (b) maintain a constant switch frequency having a first on time and a first off time; and
   a second circuit configured to (a) generate a shifted signal based on a phase delay with respect to said output signal and (b) maintain a shifted frequency having a second on time and a second off time, wherein (i) said second on time follows said first on time by a constant amount of said phase delay, (ii) said second on time is based on (a) said first on time and (b) transient conditions of a load, (iii) said apparatus implements an automatic phase shift adjustment, (iv) a current sensing comparison is performed within a decision window during said first off time and said second off time and (v) said current sensing comparison implements a cycle-by-cycle current comparison between a current of said output signal and a current of said shifted signal to (i) determine said second on time of said second circuit and (ii) perform a tuning operation to achieve inductor current balancing.

2. The apparatus according to claim 1, wherein said tuning operation is configured to adjust said second on time to match said current of said shifted signal to said current of said output signal.

3. The apparatus according to claim 1, wherein said tuning operation is configured to adjust said second on time for fast inductor current balancing by at least one of (i) a digital increment and (ii) a digital decrement.

4. The apparatus according to claim 1, wherein said automatic phase shift adjustment is configured to maintain a phase difference at 180 degrees between said constant switch frequency and said shifted frequency when said load is stable.

5. The apparatus according to claim 1, wherein said first on time is kept and said first off time is adjusted to catch a change caused by said transient conditions of said load.

6. The apparatus according to claim 1, wherein (i) said transient conditions of said load comprise a load step down, (ii) said first off time is extended to catch said transient conditions, (iii) said second on time is asserted after said phase delay and (iv) said second off time is extended automatically to follow said first off time.

7. The apparatus according to claim 1, wherein (i) said transient conditions of said load comprise a gentle step up, (ii) said first off time is reduced, (iii) a phase difference between said constant switch frequency and said shifted frequency is less than 180 degrees, (iv) said current sensing comparison is performed after said second off time during said decision window and (v) said phase difference automatically returns to 180 degrees as said load returns to a steady state.

8. The apparatus according to claim 1, wherein (i) said transient conditions of said load comprise a fast step up, (ii) said second on time is asserted at a same time as a next of said first on time, (iii) said constant switch frequency and said shifted frequency have synchronized switching, (iv) said decision window ends after said next of said first on time and (v) as said transient conditions settle said first off time is increased until a phase difference between said constant switch frequency and said shifted frequency automatically returns to 180 degrees.

9. The apparatus according to claim 1, wherein said current sensing comparison is implemented by said second circuit.

10. The apparatus according to claim 1, wherein said current sensing comparison comprises (i) sampling and holding a first maximum current of said output signal at a first time, (ii) sampling and holding a second maximum current of said shifted signal at a second time, (iii) comparing said first maximum current and said second maximum current during said decision window and (iv) generating a digital code for adjusting a next of said second on time.

11. The apparatus according to claim 1, wherein said current sensing comparison comprises (i) determining an offset between (a) a first maximum current of said output signal and (b) a current of said shifted signal at a first time in response to (a) said phase delay and (b) a slope, (ii) comparing (a) a current of said output signal and (b) a second maximum current of said shifted signal in real time based on said offset during said decision window and (iii) generating a digital code for adjusting a next of said second on time.

12. The apparatus according to claim 1, wherein said automatic phase shift adjustment is configured to enable steady phase alignment for multi-phase operation.

13. The apparatus according to claim 1, wherein said tuning operation implements a dynamic tuning of (i) said current of said output signal though a first inductor and (ii) said current of said shifted signal through a second inductor.

14. The apparatus according to claim 13, wherein said inductor current balancing comprises matching said current of said shifted signal through said second inductor to said current of said output signal through said first inductor.

15. The apparatus according to claim 1, wherein said second circuit comprises decision making logic configured to receive signals from said first circuit to generate timing signals for determining said decision window.

* * * * *